(12) United States Patent
Lee et al.

(10) Patent No.: US 12,219,799 B2
(45) Date of Patent: Feb. 4, 2025

(54) DISPLAY APPARATUS

(71) Applicant: Samsung Display Co., Ltd., Yongin-Si (KR)

(72) Inventors: Hyeonbum Lee, Yongin-si (KR); Hyunduck Cho, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 429 days.

(21) Appl. No.: 17/513,949

(22) Filed: Oct. 29, 2021

(65) Prior Publication Data
US 2022/0246881 A1  Aug. 4, 2022

(30) Foreign Application Priority Data
Feb. 4, 2021  (KR) .................. 10-2021-0016280

(51) Int. Cl.
*H10K 50/844* (2023.01)
*H10K 50/86* (2023.01)
*H10K 59/122* (2023.01)
*H10K 59/35* (2023.01)
*H10K 59/40* (2023.01)

(52) U.S. Cl.
CPC ......... *H10K 50/844* (2023.02); *H10K 50/865* (2023.02); *H10K 59/122* (2023.02); *H10K 59/353* (2023.02); *H10K 59/40* (2023.02)

(58) Field of Classification Search
CPC .. H10K 50/844; H10K 50/865; H10K 59/122; H10K 59/353; H10K 59/40; H10K 59/50; H10K 59/12; H10K 59/10; H10K 59/124; H10K 59/38; H10K 59/126
See application file for complete search history.

(56) References Cited

U.S. PATENT DOCUMENTS

| 10,330,933 B2 | 6/2019 | Jang et al. |
| 10,734,452 B1 | 8/2020 | Kim et al. |
| 10,818,209 B2 | 10/2020 | Lee et al. |
| 2015/0187857 A1* | 7/2015 | Negishi ................ H10K 59/35 257/40 |

(Continued)

FOREIGN PATENT DOCUMENTS

| KR | 10-2018-0036865 A | 4/2018 |
| KR | 10-1957145 B1 | 3/2019 |
| KR | 10-2019-0043900 A | 4/2019 |

(Continued)

*Primary Examiner* — Kyoung Lee
(74) *Attorney, Agent, or Firm* — Innovation Counsel LLP

(57) ABSTRACT

A display apparatus includes a substrate, a display layer disposed on the substrate, the display layer including an emission area, an upper organic insulating layer disposed over the display layer, the upper organic insulating layer having a first opening overlapping the emission area, a lower light-blocking layer disposed on the upper organic insulating layer, the lower light-blocking layer having a second opening overlapping the first opening in a plan view, an upper planarization layer covering the lower light-blocking layer, the upper planarization layer filling the first opening, and an upper light-blocking layer disposed on the upper planarization layer, the upper light-blocking layer overlapping the lower light-blocking layer in a plan view and having a third opening overlapping the second opening in a plan view.

20 Claims, 13 Drawing Sheets

(56) References Cited

U.S. PATENT DOCUMENTS

2019/0206965 A1 7/2019 Negishi et al.
2020/0266392 A1* 8/2020 Lee .................... H10K 59/40

FOREIGN PATENT DOCUMENTS

| KR | 10-2019-0048391 A | 5/2019 |
| KR | 10-2020-0089379 A | 7/2020 |
| KR | 10-2143299 B1 | 8/2020 |

* cited by examiner

DISPLAY APPARATUS

CROSS-REFERENCE TO RELATED APPLICATION

This application is based on and claims priority under 35 U.S.C. § 119 to Korean Patent Application No. 10-2021-0016280, filed on Feb. 4, 2021, in the Korean Intellectual Property Office, the disclosure of which is incorporated by reference herein in its entirety.

BACKGROUND

1. Field

One or more embodiments of the disclosure relate to a display apparatus, and more particularly, to a display apparatus having an improved performance of adjusting a viewing angle.

2. Description of the Related Art

Display apparatuses have been used for various purposes. In addition, as display apparatuses have reduced thickness and light weight, the scope of utilizing the display apparatuses has increased, and as the display apparatuses have been used in various fields, the demand for display apparatuses capable of providing high-quality images has increased.

Among display apparatuses, organic light-emitting display apparatuses have been highlighted as next-generation display devices due to their wide viewing angles, high contrast, and fast response speeds.

SUMMARY

According to a display apparatus of the related art, light emitted from a display apparatus may be reflected by external objects adjacent to the display apparatus and cause user's inconvenience.

One or more embodiments include a display apparatus having an improved performance of adjusting a viewing angle. However, the above technical features are exemplary, and the scope of the disclosure is not limited thereto.

Additional aspects will be set forth in part in the description which follows and, in part, will be apparent from the description, or may be learned by practice of the presented embodiments of the disclosure.

According to an embodiment, a display apparatus includes a substrate, a display layer disposed over the substrate, the display layer including an emission area, an upper organic insulating layer disposed over the display layer, the upper organic insulating layer having a first opening exposing the emission area, a lower light-blocking layer disposed on the upper organic insulating layer, the lower light-blocking layer having a second opening overlapping the first opening in a plan view, an upper planarization layer covering the lower light-blocking layer, the upper planarization layer filling the first opening, and an upper light-blocking layer disposed on the upper planarization layer, the upper light-blocking layer overlapping the lower light-blocking layer in a plan view and having a third opening overlapping the second opening in a plan view.

The lower light-blocking layer may include a blocking portion at least partially covering an inner side surface of the upper organic insulating layer which extend obliquely to the substrate.

The display layer may include a pixel defining layer having a pixel opening exposing the emission area, and a distance from an edge of the blocking portion in a direction of the emission area to a center of the emission area may be equal to a distance from an edge of the pixel defining layer in a direction of the emission area to the center of the emission area in a plan view.

The lower light-blocking layer may further include a non-blocking portion not covering the inner side surface of the upper organic insulating layer in a plan view.

A distance from an edge of the non-blocking portion in a direction of the emission area to the center of the emission area may be greater than a distance from the edge of the pixel defining layer in a direction of the emission area to the center of the emission area in a plan view.

A distance from an edge of the lower light-blocking layer in a direction of the emission area to a center of the emission area may be equal to a distance from an edge of the upper light-blocking layer in a direction of the emission area to the center of the emission area in a plan view.

The display layer may include an organic light-emitting diode having a first electrode, a second electrode, and an intermediate layer between the first electrode and the second electrode, the intermediate layer including an emission layer, and a vertical distance from a lower surface of the upper light-blocking layer to an upper surface of the emission layer may be about 25 μm or greater.

The upper planarization layer may have a refractive index that is greater than a refractive index of the upper organic insulating layer.

According to another embodiment, a display apparatus includes a substrate, a display layer disposed on the substrate, the display layer including a plurality of emission areas, an upper organic insulating layer disposed over the display layer, the upper organic insulating layer having a first opening exposing each of the plurality of emission areas, a lower light-blocking layer disposed on the upper organic insulating layer, the lower light-blocking layer having a second opening overlapping the first opening, an upper planarization layer covering the lower light-blocking layer, the upper planarization layer filling the first opening, and a color filter layer disposed on the upper planarization layer, the color filter layer including a light-blocking area overlapping the lower light-blocking layer in a plan view, wherein a plurality of color filters are arranged to overlap one another in the light-blocking area.

The plurality of emission areas may include a first color emission area, a second color emission area, and a third color emission area, the plurality of color filters may include a first-color color filter covering the first color emission area, a second-color color filter covering the second color emission area, and a third-color color filter covering the third color emission area, and the first-color color filter, the second-color color filter, and the third-color color filter may overlap one another in the light-blocking area.

The lower light-blocking layer may include a blocking portion at least partially covering an inner side surface of the upper organic insulating layer which extend obliquely to the substrate, and the light-blocking area may overlap the blocking portion.

The display layer may include a pixel defining layer having a pixel opening exposing the emission area, and a distance from an edge of the blocking portion in a direction of the emission area to a center of the emission area may be equal to a distance from an edge of the pixel defining layer in the direction of the emission area to the center of the emission area.

The lower light-blocking layer may include a non-blocking portion not covering an inner side surface of the upper organic insulating layer in a plan view, and the light-blocking area may overlap the non-blocking portion.

A distance from an edge of the non-blocking portion in the direction of the emission area to the center of the emission area may be greater than a distance from the edge of the pixel defining layer in the direction of the emission area to the center of the emission area in a plan view.

A distance from an edge of the lower light-blocking layer in a direction of the emission area to a center of the emission area may be equal to a distance from an edge of the light-blocking area in a direction of the emission area to the center of the emission area in a plan view.

The upper planarization layer may have a refractive index that is greater than a refractive index of the upper organic insulating
layer.

According to another embodiment, a display apparatus includes a substrate, a display layer disposed on the substrate, the display layer including an emission area, an upper organic insulating layer disposed over the display layer, the upper organic insulating layer having a first opening exposing the emission area, the upper organic insulating layer including an inner side surface extending obliquely to the substrate, and a lower light-blocking layer disposed on the upper organic insulating layer, the lower light-blocking layer having a second opening overlapping the first opening in a plan view. The lower light-blocking layer may overlap at least a portion of the inner side surface of the upper organic insulating layer in a plan view. The display apparatus may further include an upper planarization layer covering the lower light-blocking layer, the upper planarization layer filling the first opening, and an upper light-blocking layer disposed on the upper planarization layer, the upper light-blocking layer overlapping the lower light-blocking layer in a plan view and having a third opening overlapping the second opening in a plan view.

The lower light blocking layer may overlap opposing inner side surfaces of the upper organic insulating layer in a plan view.

The lower light blocking layer may overlap all of inner side surfaces of the upper organic insulating layer in a plan view.

Other aspects, features and advantages of the disclosure will become better understood through the accompanying drawings, the claims and the detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
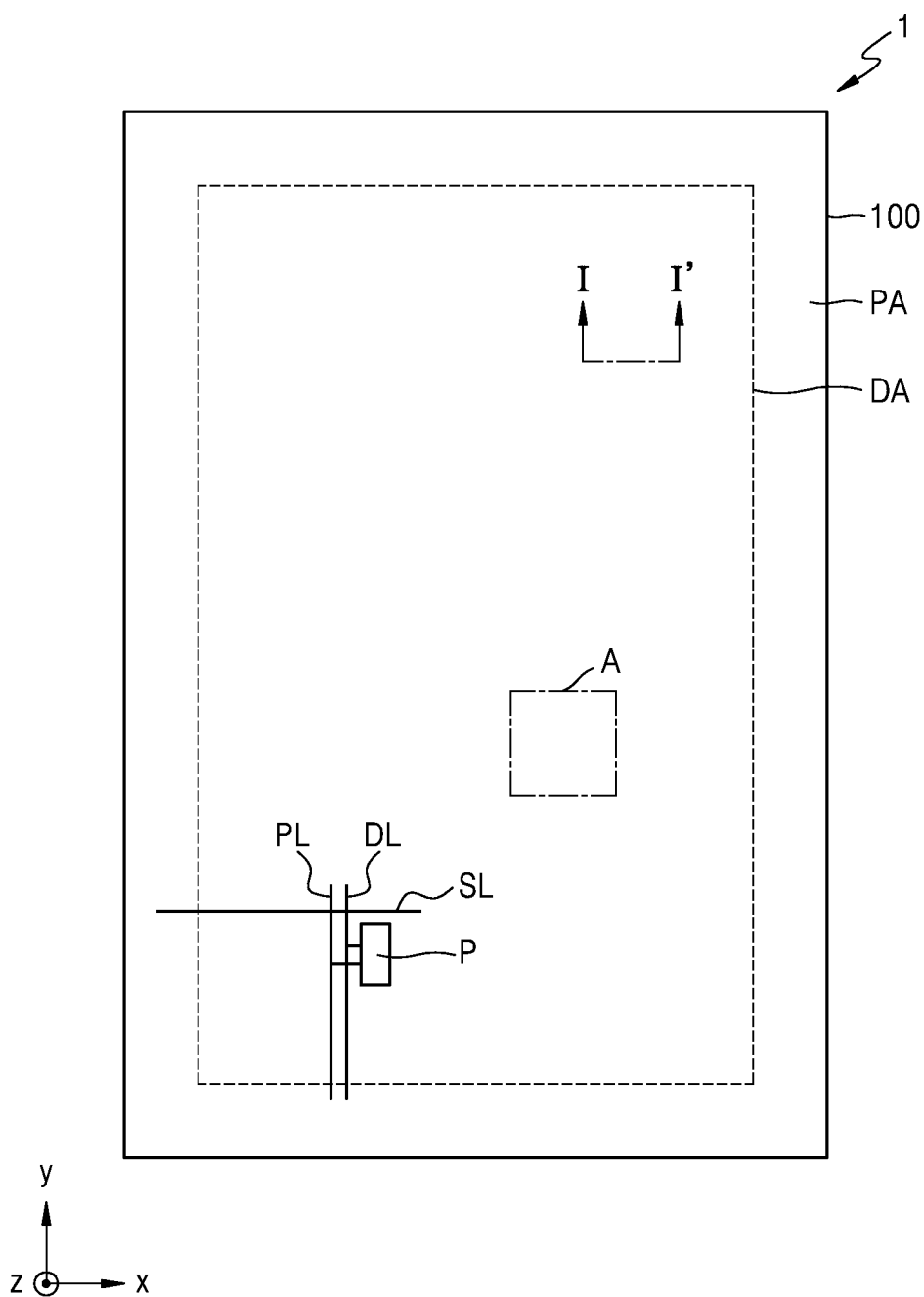
FIG. 1 is a schematic plan view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, particular embodiments will be illustrated in the drawings and described in detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

While such terms as "first," "second," etc., may be used to describe various components, such components are not be limited to the above terms. The above terms are used only to distinguish one component from another.

An expression used in the singular encompasses the expression of the plural unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it may be directly or indirectly formed on the other layer, region, or component. That is, for example, intervening layers, regions, or components may be present.

When a certain embodiment may be implemented differently, a specific process order may be performed differently from the described order. For example, two consecutively described processes may be performed substantially at the same time or performed in an order opposite to the described order.

In the specification, the phrase "A and/or B" denotes A, B, or A and B. In addition, the phrase "at least one of A and B" denotes A, B, or A and B.

In the embodiments below, when layers, areas, or elements or the like are referred to as being "connected," it will be understood that they may be directly connected or an intervening portion may be present between layers, areas or elements. For example, when layers, areas, or elements or the like are referred to as being "electrically connected," they may be directly electrically connected, or layers, areas or elements may be indirectly electrically connected and an intervening portion may be present.

The x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

The embodiments will be described below in more detail with reference to the accompanying drawings. Those components that are the same or are in correspondence are rendered the same reference numeral regardless of the figure number, and redundant explanations are omitted.

FIG. 1 is a schematic plan view of a display apparatus 1 according to an embodiment.

As shown in FIG. 1, the display apparatus 1 according to an embodiment may include a display area DA emitting light, and a peripheral area PA that does not emit light. A substrate 100 included in the display apparatus 1 may include an area corresponding to the display area DA and an area corresponding to the peripheral area PA.

The display area DA may include pixels P each of which is at a point where a scan line SL extending in an x-axis direction and a data line DL extending in a y-axis direction cross each other. The display area DA includes an emission area EA (see FIG. 5) that may display images. Each of the pixels P may include a pixel circuit connected to the scan line SL and the data line DL, and a display element connected to the pixel circuit.

Each of the pixels P in the display apparatus 1 may include a light-emitting diode as a display element emitting light of a predetermined color. The light-emitting diode may include an organic light-emitting diode including an organic material as an emission layer. Alternatively, the light-emitting diode may include an inorganic light-emitting diode. Alternatively, the light-emitting diode may include quantum dots as an emission layer. Hereinafter, a case in which the light-emitting diode includes an organic light-emitting diode will be described for convenience of description.

In FIG. 1, the display apparatus 1 includes the display area DA of a square shape, but the display area DA may have an arbitrary shape such as a circular shape, an elliptical shape, a polygonal shape, etc.

The peripheral area PA may at least partially surround the display area DA. For example, the peripheral area PA may entirely surround the display area DA. Various lines for transferring electrical signals that are to be applied to the display area DA may be in the peripheral area PA. Also, a circuit for controlling the electrical signals applied to the display area DA may be disposed partially in the peripheral area PA.

The peripheral area PA may include a pad region (not shown). A pad portion including a plurality of pads may be in the pad region. Each of the plurality of pads included in the pad portion may be electrically connected to pads of a printed circuit board so as to receive a signal input through the printed circuit board. To do this, the pad portion may include the plurality of pads. The plurality of pads may not be covered by an insulating layer, but are exposed to be electrically connected to the printed circuit board, etc.

Figure 2:
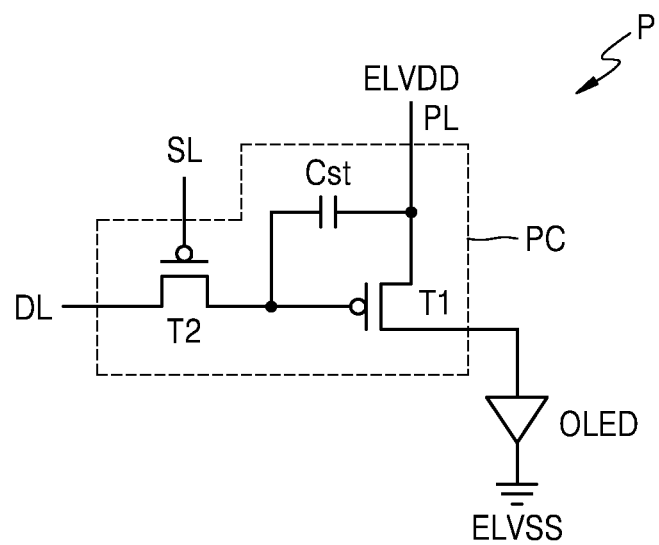
FIG. 2 is an equivalent circuit diagram of one pixel in a display apparatus according to an embodiment.

FIG. 2 is an equivalent circuit diagram of one pixel in the display apparatus 1 according to an embodiment.

Each of the pixels P included in the display apparatus 1 (see FIG. 1) according to the embodiment may include a pixel circuit PC and an organic light-emitting diode OLED connected to the pixel circuit PC.

The pixel circuit PC may include a first thin film transistor T1, a second thin film transistor T2, and a storage capacitor Cst. Each pixel P may emit, for example, red light, green light, or blue light via the organic light-emitting diode OLED, or may emit red light, green light, blue light, or white light via the organic light-emitting diode OLED.

The second thin film transistor T2 is a switching thin film transistor. A gate electrode of the second thin film transistor T2 is connected to a scan line SL and one electrode of the second thin film transistor T2 is connected to a data line DL. The second thin film transistor T2 may transfer a data voltage input from the data line DL to a node connected to a gate electrode of the first thin film transistor T1 according to a switching voltage input from the scan line SL. The storage capacitor Cst is connected between the gate electrode of the first thin film transistor T1 and a driving voltage line PL and may store a voltage corresponding to a difference between a voltage transferred from the second thin film transistor T2 and a first power voltage ELVDD supplied to the driving voltage line PL.

The first thin film transistor T1 is a driving thin film transistor. One electrode of the first thin film transistor T1 is connected to the driving voltage line PL and the storage capacitor Cst and may control a driving current flowing through the organic light-emitting diode OLED from the driving voltage line PL corresponding to the voltage value stored in the storage capacitor Cst. The organic light-emitting diode OLED may emit light having a certain luminance according to the driving current. A second electrode (e.g., a cathode) of the organic light-emitting diode OLED may receive a second power voltage ELVSS.

In addition, FIG. 2 illustrates that the pixel circuit PC includes two thin film transistors T1 and T2 and one storage capacitor Cst, but one or more embodiments are not limited thereto. That is, the number of thin film transistors and the number of capacitors included in the pixel circuit PC may vary depending on a design of the pixel circuit PC. For example, the pixel circuit PC may include four or more thin-film transistors in addition to the two thin-film transistors described above. In addition, one or more capacitors may be further provided in addition to the above storage capacitor Cst.

Figure 3:
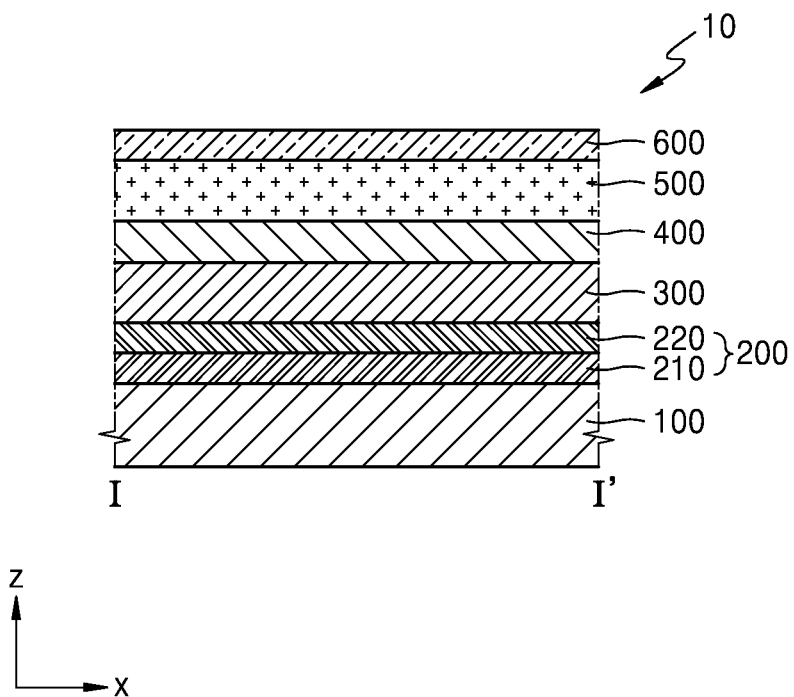
FIG. 3 is a schematic cross-sectional view of a display panel included in a display apparatus according to an embodiment.

FIG. 3 is a schematic cross-sectional view of a display panel 10 included in a display apparatus according to an embodiment.

The display panel 10 included in the display apparatus 1 (see FIG. 1) according to an embodiment may include a substrate 100, a display layer 200, an encapsulation layer 300, a touch electrode layer 400, a first functional layer 500, and a second functional layer 600.

The substrate 100 may include glass, metal, or a polymer resin. When the substrate 100 is flexible or bendable, the substrate 100 may include a polymer resin such as a polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may be variously modified, for example, the substrate 100 may have a multi-layered structure including two layers each having a polymer resin and a barrier layer including an inorganic material such as silicon oxide, silicon nitride, silicon oxynitride, etc. between the two layers.

The display layer 200 may be disposed on the substrate 100. The display layer 200 may include a pixel circuit layer 210 and a display element layer 220. The pixel circuit layer 210 may include a plurality of pixel circuits PC (see FIG. 2). The display element layer 220 may include a plurality of display elements respectively connected to the plurality of pixel circuits PC. Each of the display elements 220 included in the display element layer 220 may constitute a pixel P (see FIG. 1). The pixel circuit layer 210 may include a plurality of thin film transistors and a plurality of storage capacitors.

The encapsulation layer 300 may be disposed on the display layer 200. The encapsulation layer 300 may prevent the display elements included in the display element layer 220 from being damaged due to external foreign matters such as moisture. The encapsulation layer 300 may include at least one inorganic encapsulation layer and at least one organic encapsulation layer.

The touch electrode layer 400 may be disposed on the encapsulation layer 300. The touch electrode layer 400 may sense an external input, e.g., a touch input from a user, and may obtain coordinate information according to the input. The touch electrode layer 400 may employ at least one of various touch methods such as a resistive overlay method, a capacitive overlay method, etc., but is not limited thereto.

The first functional layer 500 may be disposed on the touch electrode layer 400. The first functional layer 500 may have a structure for improving light-emitting efficiency of the light emitted from the display elements. In an embodiment, the first functional layer 500 may include an optical layer 510 (see FIG. 5) and a lower light-blocking layer 520 (see FIG. 5). The optical layer 510 may improve an optical performance of the display panel 10. The lower light-blocking layer 520 blocks a path of light which is slantly emitted from the display element layer 220 and/or light incident into the display panel 10 from outside and reflected slantly from the display panel 10 so as to improve a performance of the display panel 10 for adjusting a viewing angle. Components included in the first functional layer 500 will be described later with reference to FIG. 5.

The second functional layer 600 may be disposed on the first functional layer 500. In an embodiment, the second functional layer 600 may include an upper light-blocking layer 610 (see FIG. 5) and/or a color filter layer 620 (see FIG. 10). The second functional layer 600 blocks a path of light which is slantly emitted from the display element layer 220 and/or light incident into the display panel 10 from outside and reflected slantly from the display panel 10 so as to improve a performance of the display panel 10 for adjusting a viewing angle. The second functional layer 600 will be described later in detail with reference to FIGS. 5 and 10.

Figure 4A:
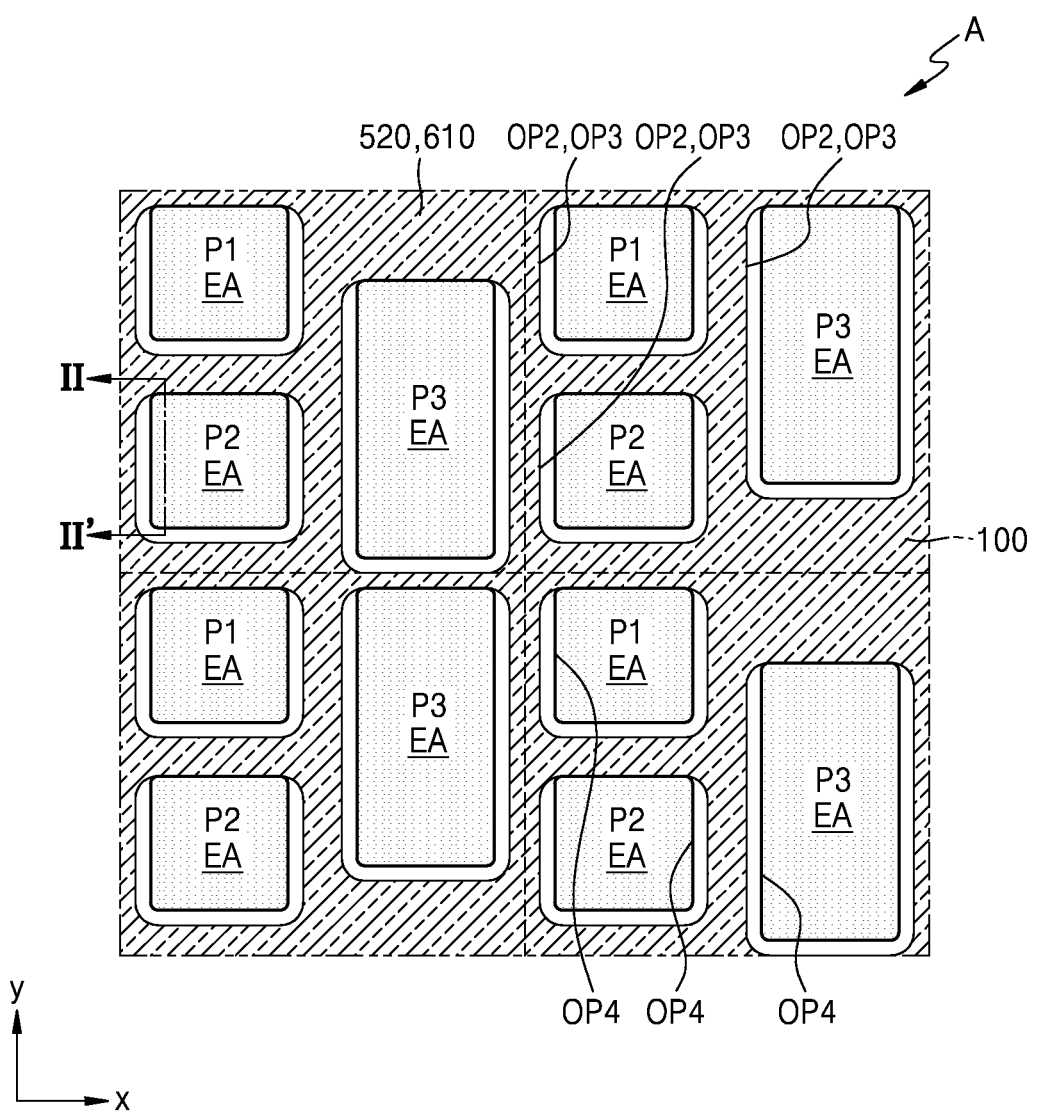
FIG. 4A is a schematic plan view partially showing a display apparatus according to an embodiment.
Figure 4B:
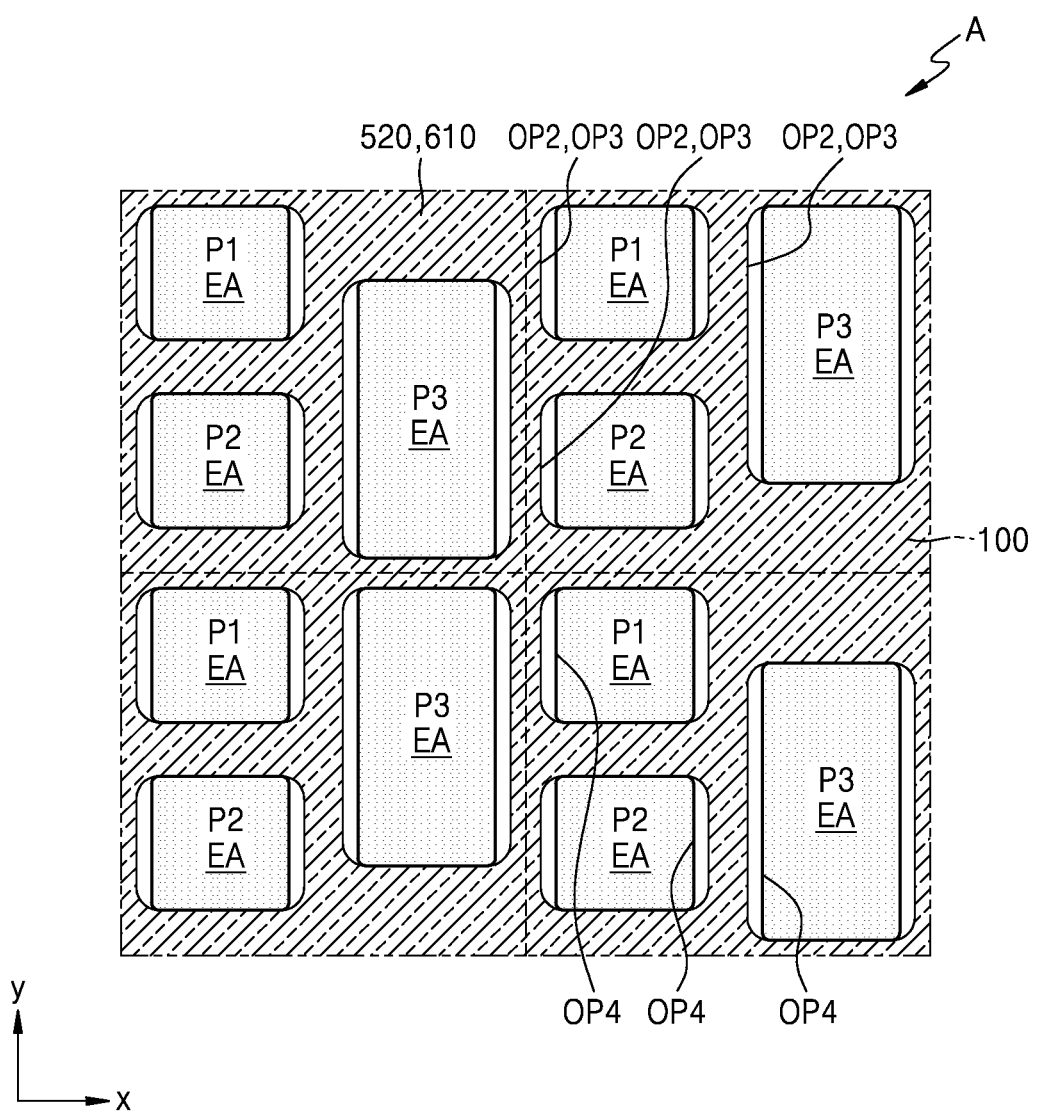
FIG. 4B is a schematic plan view partially showing a display apparatus according to another embodiment.
Figure 4C:
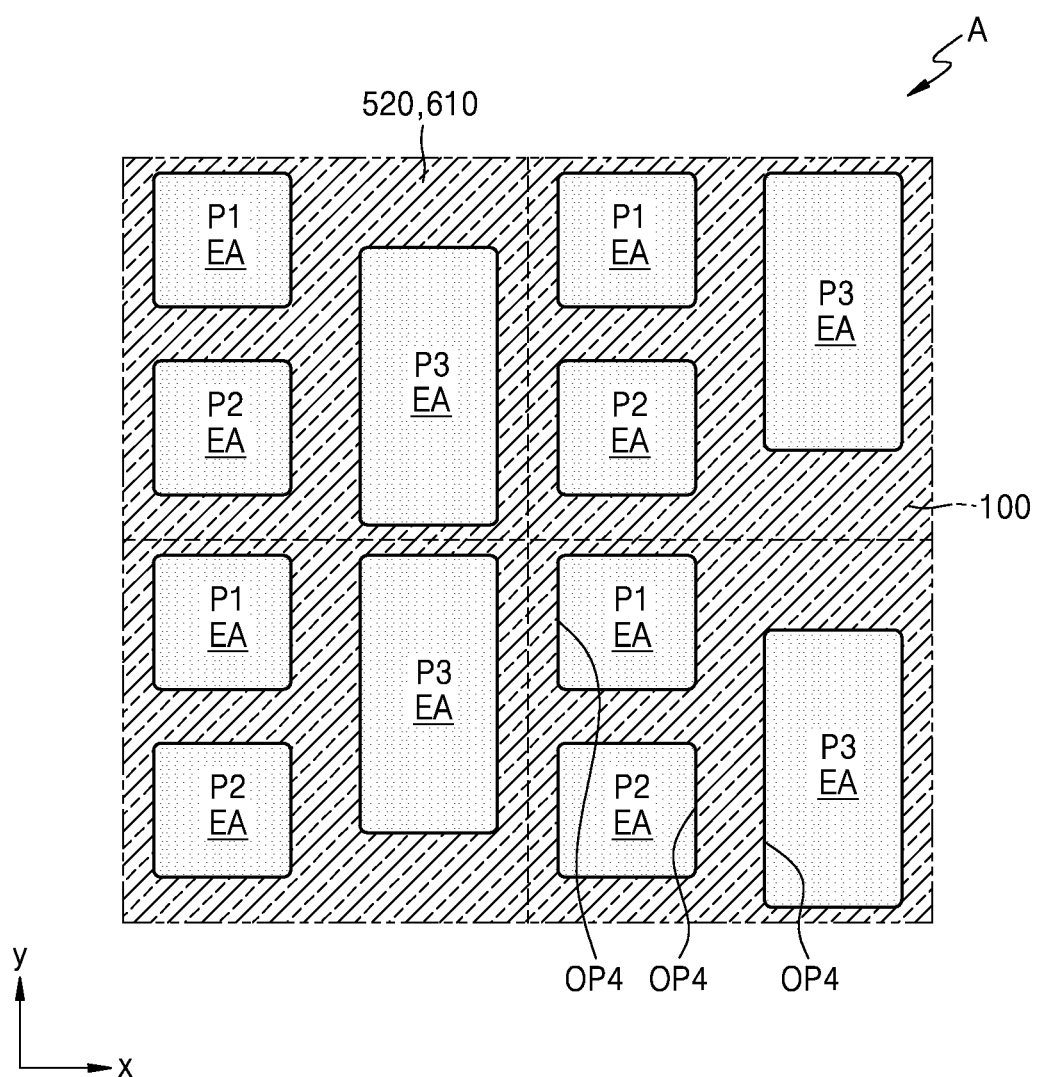
FIG. 4C is a plan view partially showing a display apparatus according to another embodiment.

FIGS. 4A to 4C are plan views illustrating some regions of a display apparatus according to an embodiment.

FIGS. 4A to 4C are plan views respectively showing enlarged portions of components that may be included in region A of FIG. 1. In addition, in FIGS. 4A to 4C, components other than the lower light-blocking layer 520 and the upper light-blocking layer 610 from among the components on the substrate 100 are omitted for convenience of description.

A plurality of pixels are disposed on the substrate 100 and each of the pixels includes an emission area EA. An area of the pixel may include an area of the emission area EA included in each pixel. Also, each of the emission areas EA may be defined by a pixel opening OP4 in a pixel defining layer 209 (see FIG. 5). That is, in a plan view, the pixel defining layer 209 entirely covers the substrate 100 and includes the pixel openings OP4 overlapping the emission areas EA to define the emission areas EA.

As shown in FIGS. 4A to 4C, the display apparatus 1 (see FIG. 1) according to an embodiment may include a first pixel P1, a second pixel P2, and a third pixel P3. The pixel defining layer 209 includes the pixel openings OP4 respectively overlapping the emission areas EA of the first pixel P1, the second pixel P2, and the third pixel P3.

In an embodiment, the first pixel P1 may emit first color light, the second pixel P2 may emit second color light, and the third pixel P3 may emit third color light. The first pixel P1 includes a first color emission area EA1 (see FIG. 6), the second pixel P2 includes a second color emission area EA2 (see FIG. 6), and the third pixel P3 includes a third color emission area EA3 (see FIG. 6). In an embodiment, the first color may be blue, the second color may be green, and the third color may be red, but one or more embodiments are not limited thereto. For example, the first color may be red, the second color may be green, and the third color may be blue, or the like.

In addition, in FIGS. 4A to 4C, the emission areas EA of the pixels have rectangular shapes having round corners, but one or more embodiments are not limited thereto. The emission areas EA in the pixels may have arbitrary shapes, e.g., circular shape, elliptical shape, polygonal shape, polygonal shape having round corners, etc. In addition, arrangement of the pixels or arrangement of the emission areas EA may be altered as required. For example, in FIGS. 4A to 4C, the pixels or the emission areas EA are arranged as stripes, but the pixels or the emission areas EA may be arranged in various structures, e.g., Pentile structure, mosaic structure, delta structure, etc.

Also, area of the pixels or area of the emission areas EA may be variously changed as required. For example, as shown in FIGS. 4A to 4C, the area of the emission area EA in the third pixel P3 may be greater than that of the emission area EA in the first pixel P1 and that of the emission area EA in the second pixel P2. Unlike the examples shown in FIGS. 4A to 4C, the relationship among the areas of the emission areas EA in the first pixel P1, the second pixel P2, and the third pixel P3 may be changed. Also, the emission areas EA in the first pixel P1, the second pixel P2, and the third pixel P3 may have substantially the same areas.

The lower light-blocking layer 520 may be disposed over the pixel defining layer 209. The lower light-blocking layer 520 includes a second opening OP2 overlapping the emission area EA and the pixel opening OP4. That is, the lower light-blocking layer 520 entirely covers the substrate 100 in a plan view except the second opening OP2 overlapping the emission area EA and the pixel opening OP4 so as to entirely surround each of the emission areas EA.

The upper light-blocking layer 610 that is an example of the second functional layer 600 (see FIG. 3) may be disposed over the lower light-blocking layer 520. The upper light-blocking layer 610 overlaps the lower light-blocking layer 520. The upper light-blocking layer 610 has a third opening OP3 overlapping the emission area EA, the pixel opening OP4, and the second opening OP2 of the lower light-blocking layer 520. That is, the upper light-blocking layer 610 entirely covers the substrate 100 in a plan view except the third opening OP3 overlapping the emission area EA, the pixel opening OP4, and the second opening OP2 of the lower light-blocking layer 520 so as to entirely surround each of the emission areas EA.

In an embodiment, in a plan view, an area of the second opening OP2 of the lower light-blocking layer 520 may be the same as that of the third opening OP3 in the upper light-blocking layer 610. That is, in a plan view, an edge of the second opening OP2 in the lower light-blocking layer 520 may coincide with an edge of the third opening OP3 in the upper light-blocking layer 610. In other words, when seen from a direction perpendicular to the substrate 100, a distance from the edge of the lower light-blocking layer 520 in a direction toward the emission area EA to the center of the emission area EA may be equal to a distance from the edge of the upper light-blocking layer 610 in a direction toward the emission area EA to the center of the emission area EA. In the present specification, the edge of the opening denotes an edge of a lower surface of a layer in which the opening is provided.

In a plan view, the edge of the second opening OP2 in the lower light-blocking layer 520 may at least partially coincide with the edge of the pixel opening OP4. That is, in a plan view, the edge of the second opening OP2 in the lower light-blocking layer 520 may at least partially coincide with the edge of the emission area EA. In the edge of the second opening OP2 in the lower light-blocking layer 520, a portion corresponding to the edge of the emission area EA may be a blocking portion 520a (see FIG. 5) having an excellent effect of blocking the path of light proceeding toward the emission area EA with a slanted angle, not to the front of the emission area EA (e.g., in a direction perpendicular to an upper surface of an emission layer), and a remaining portion may be a non-blocking portion 520b (see FIG. 5). As described above, the blocking portion 520a is selectively provided at the edge of the emission areas EA, a performance of adjusting a viewing angle according to viewing directions in the display apparatus 1 (see FIG. 1) may be improved. The blocking portion 520a and the non-blocking portion 520b will be described later in detail with reference to FIG. 5.

In a plan view, because the edge of the third opening OP3 in the upper light-blocking layer 610 and the edge of the second opening OP2 in the lower light-blocking layer 520 correspond to each other, the arrangement between the upper light-blocking layer 610 and the emission area EA may be the same as that between the lower light-blocking layer 520 and the emission area EA.

In addition, in the edge of the emission area EA, the portion corresponding to the edge of the second opening OP2 in the lower light-blocking layer 520 and/or the edge of the third opening OP3 in the upper light-blocking layer 610 may be selectively decided to improve the performance of adjusting the viewing angle and may be variously modified according to the design.

In an embodiment, as shown in FIG. 4A, the edge of the emission area EA on an upper side of the emission area EA may coincide with the edge of the second opening OP2 of the lower light-blocking layer 520 and/or the edge of the third opening OP3 in the upper light-blocking layer 610 in a plan view and other edges of the emission area EA (e.g., left, right, and lower sides of the emission area EA) may not coincide with edges of the second opening OP2 of the lower light-blocking layer 520 and/or edges of the third opening OP3 in the upper light-blocking layer 610.

In another embodiment, as shown in FIG. 4B, edges of the emission area EA on the upper side and a lower side of the emission area EA may coincide with edges of the second opening OP2 of the lower light-blocking layer 520 and/or edges of the third opening OP3 in the upper light-blocking layer 610 in a plan view and other edges of the emission area EA (e.g., left and right sides of the emission area EA) may not coincide with edges of the second opening OP2 of the lower light-blocking layer 520 and/or edges of the third opening OP3 in the upper light-blocking layer 610 in a plan view.

In another embodiment, as shown in FIG. 4C, edges of the emission area EA on an upper side, a lower side, a left side and a right side of the emission area EA may coincide with edges of the second opening OP2 of the lower light-blocking layer 520 and/or edges of the third opening OP3 in the upper light-blocking layer 610 in a plan view. In this case, in a plan view, the edge of the second opening OP2 in the lower light-blocking layer 520 and/or the edge of the third opening OP3 in the upper light-blocking layer 610 may entirely be identical with the edge of the pixel opening OP4 and the edge of the emission area EA.

In another embodiment, edges of the emission area EA coincide with edges of the second opening OP2 of the lower light-blocking layer 520 and/or edges of the third opening OP3 in the upper light-blocking layer 610 may be disposed on at least one of a left side, a right side, an upper side and a lower side of the emission area EA in a plan view. In this case, the edge of the second opening OP2 and/or the third opening OP3 may correspond to the edge of the emission area EA and/or the edge of the pixel opening OP4.

Figure 5:
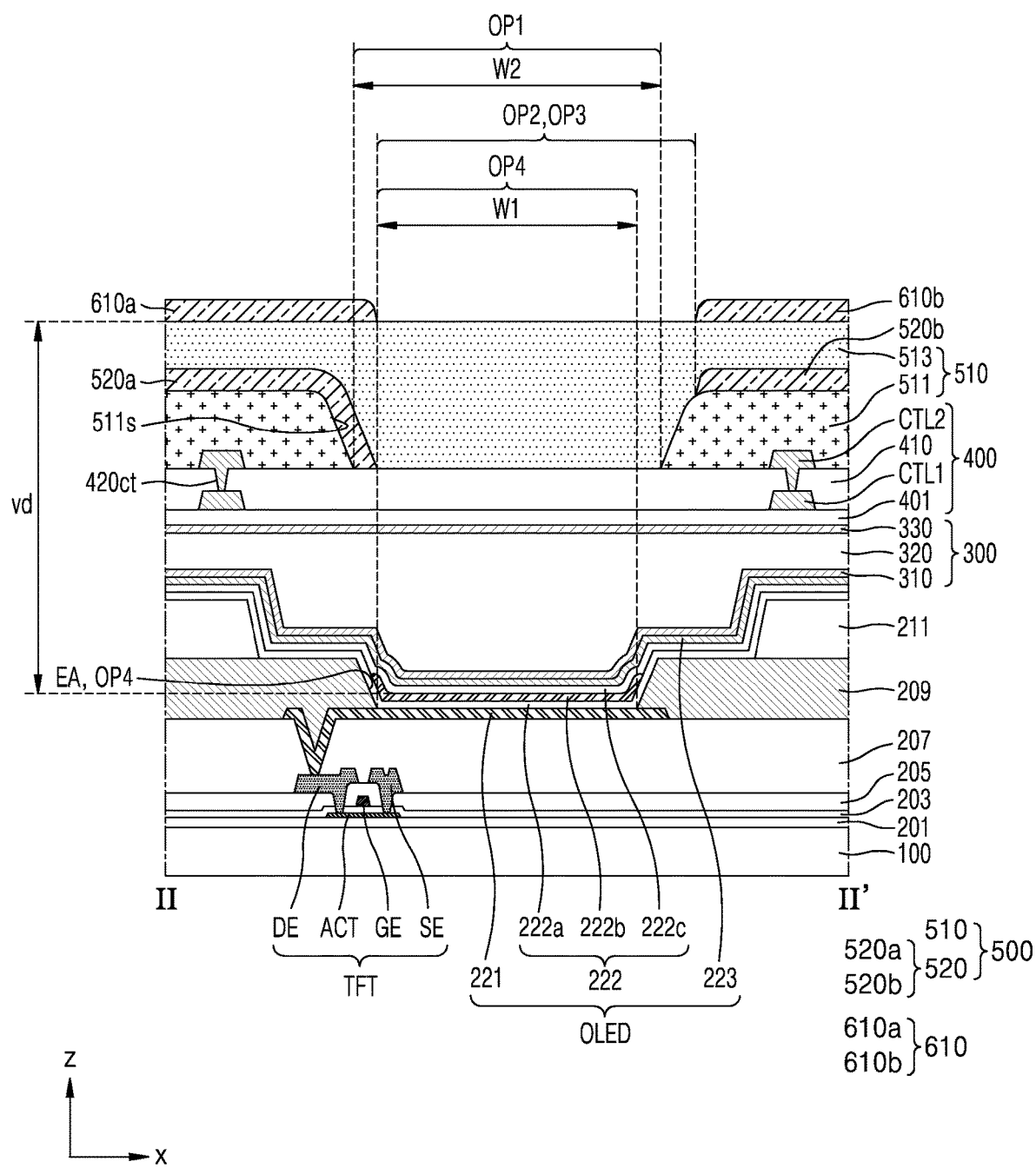
FIG. 5 is a schematic cross-sectional view showing a region of the display apparatus of FIG. 4A.

FIG. 5 is a cross-sectional view showing a region of the display apparatus of FIG. 4A. FIG. 5 is a cross-sectional view of the display apparatus taken along line I-I' of FIG. 4A.

Referring to FIG. 5, a buffer layer 201 may be disposed on the substrate 100. The buffer layer 201 may reduce or prevent infiltration of impurities, moisture, or external air from below the substrate 100, and may improve flatness of an upper surface of the substrate 100. The buffer layer 201 may include an inorganic material such as an oxide material or a nitride material, an organic material, or an inorganic-organic composite material, and may have a single-layered or multi-layered structure including the inorganic material and the organic material. A barrier layer (not shown) for preventing infiltration of external air may be further provided between the substrate 100 and the buffer layer 201.

The thin film transistor TFT may be disposed on the buffer layer 201. The thin film transistor TFT may include a semiconductor layer Act, a gate electrode GE, a source electrode SE, and a drain electrode DE. In the embodiment, a top gate-type transistor in which the gate electrode GE is disposed over the semiconductor layer Act with a gate insulating layer 203 interposed therebetween is shown, but, in an alternative embodiment, the thin-film transistor TFT may be a bottom gate-type transistor.

A semiconductor layer ACT may be disposed on the buffer layer 201. The semiconductor layer ACT may include a channel region, and a source region and a drain region disposed at opposite sides of the channel region and doped with impurities. Here, the impurities may include N-type impurities or P-type impurities. The semiconductor layer ACT may include amorphous silicon or polysilicon. In another embodiment, the semiconductor layer ACT may include an oxide of at least one selected from the group consisting of indium (In), gallium (Ga), stannum (Sn), zirconium (Zr), vanadium (V), hafnium (Hf), cadmium (Cd), germanium (Ge), chrome (Cr), titanium (Ti), aluminum (Al), cesium (Cs), cerium (Ce), and zinc (Zn). The semiconductor layer ACT may include Zn oxide-based material, e.g., Zn oxide, In—Zn oxide, Ga—In—Zn oxide, etc. Alternatively, the second semiconductor layer ACT may include In-Ga—Zn-O (IGZO), In—Sn—Zn—O (ITZO), or In—Ga—Sn—Zn—O (IGTZO) semiconductor including ZnO with metal such as indium (In), gallium (Ga), and stannum (Sn).

The gate electrode GE is disposed over the semiconductor layer ACT so as to at least partially overlap the semiconductor layer ACT. In detail, the gate electrode GE may overlap the channel region of the semiconductor layer ACT. The gate electrode GE may include various conductive materials including molybdenum (Mo), aluminum (Al), copper (Cu), titanium (Ti), etc., and may have various layered structures. For example, the gate electrode GE may include a Mo layer and an Al layer, or a multi-layered structure including Mo/Al/Mo. Also, the gate electrode GE may have a multi-layered structure including an ITO layer covering a metal material.

The gate insulating layer 203 disposed between the semiconductor layer Act and the gate electrode GE may include an inorganic insulating material such as silicon oxide, silicon nitride, silicon oxynitride, aluminum oxide, titanium oxide, tantalum oxide, hafnium oxide, etc. The gate insulating layer 203 may have a single-layered or multi-layered structure including the above materials.

The source electrode SE and the drain electrode DE may be connected to the source region or the drain region of the semiconductor layer ACT via contact holes. The source electrode SE and the drain electrode DE may include various conductive materials including molybdenum (Mo), aluminum (Al), copper (Cu), titanium (Ti), etc., and may have various layered structures. For example, the source electrode SE and the drain electrode DE may each include a Ti layer and an Al layer, or a multi-layered structure including Ti/Al/Ti. Also, the source electrode SE and the drain electrode DE may have a multi-layered structure including an ITO layer covering a metal material.

An interlayer insulating layer 205 may include an inorganic insulating material such as silicon oxide, silicon nitride, silicon oxynitride, aluminum oxide, titanium oxide, tantalum oxide, hafnium oxide, etc. In addition, the interlayer insulating layer 205 may have a single-layered or multi-layered structure including the materials stated above.

In addition, the gate insulating layer 203 and the interlayer insulating layer 205 including the inorganic material may be obtained through a chemical vapor deposition (CVD) or an atomic layer deposition (ALD) method, but are not limited thereto.

The thin film transistor TFT may be covered by an organic insulating layer 207. For example, the organic insulating layer 207 may cover the source electrode SE and the drain electrode DE. The organic insulating layer 207 may be disposed on the substrate 100 throughout the display area DA (see FIG. 1) and the peripheral area PA (see FIG. 1) outside the display area DA. The organic insulating layer 207 is a planarized insulating layer and may have a flat upper surface. The organic insulating layer 207 may include a general-purpose polymer (e.g., polymethylmethacrylate (PMMA) or polystyrene (PS)), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof. In an embodiment, the organic insulating layer 207 may include polyimide.

A first electrode 221 may be disposed on the organic insulating layer 207. The first electrode 221 may include a conductive oxide such as indium tin oxide (ITO), indium zinc oxide (IZO), zinc oxide (ZnO), indium oxide ($In_2O_3$), indium gallium oxide, or aluminum zinc oxide (AZO). In another embodiment, the first electrode 221 may include a reflective layer including argentum (Ag), magnesium (Mg), aluminum (Al), platinum (Pt), palladium (Pd), aurum (Au), nickel (Ni), neodymium (Nd), iridium (Ir), chromium (Cr), or a compound thereof. In another embodiment, the first electrode 221 may further include a layer including ITO, IZO, ZnO, or $In_2O_3$ on and/or under the reflective layer.

The pixel defining layer 209 may be disposed on the first electrode 221. The pixel defining layer 209 includes the pixel opening OP4 exposing an upper surface of the first electrode 221 and may cover edges of the first electrode 221. As such, the pixel defining layer 209 may define the emission area EA. A width of the pixel opening OP4 is equal to that (first width W1) of the emission area EA. In the present specification, widths of the openings OP1, OP2, OP3, and OP4 denote distances between edges in a lower surface in which the openings are formed.

The pixel defining layer 209 may include an organic insulating material. Alternatively, the pixel defining layer 209 may include an inorganic insulating material such as silicon nitride, silicon oxynitride, or silicon oxide. Alternatively, the pixel defining layer 209 may include an organic insulating material and an inorganic insulating material. In some embodiments, the pixel defining layer 209 may be a light-blocking material and may be black. The light-blocking material may include carbon black, carbon nanotubes, a resin or a paste including black dye, metal particles, e.g., nickel, aluminum, molybdenum, and alloy thereof, metal oxide particles (e.g., chromium oxide), or metal nitride particles (e.g., chromium nitride), etc. When the pixel defining layer 209 includes the light-blocking material, external light reflection due to metal structures arranged under the pixel defining layer 209 may be reduced.

An intermediate layer 222 may include an emission layer 222b. The emission layer 222b may include an organic material. The emission layer 222b may include a polymer or low-molecular weight organic material emitting predetermined color light. The intermediate layer 222 may include a first common layer 222a disposed under the emission layer 222b and/or a second common layer 222c disposed on the emission layer 222b.

The first common layer 222a may have a single-layered or multi-layered structure. For example, when the first common layer 222a includes a polymer material, the first common layer 222a includes a hole transport layer (HTL) having a single-layered structure, and may include poly-(3,4)-ethylene-dihydroxy thiophene (PEDOT) or polyaniline (PANI). When the first common layer 222a includes a low-molecular weight material, the first common layer 222a may include a hole injection layer (HIL) and an HTL.

The second common layer 222c may be optional. For example, when the first common layer 222a and the emission layer 222b include a polymer material, the second common layer 222c may be provided. The second common layer 222c may have a single-layered or multi-layered structure. The second common layer 222c may include an electron transport layer (ETL) and/or an electron injection layer (EIL).

The emission layer 222b of the intermediate layer 222 may be in every pixel of the display area DA. The emission layer 222b may overlap the pixel opening OP4 of the pixel defining layer 209 and/or the first electrode 221. In the intermediate layer 222, the first and second common layers 222a and 222c may be each provided as a single body throughout the pixels.

The second electrode 223 may include a conductive material having a low work function. For example, the second electrode 223 may include a (semi-)transparent layer including argentum (Ag), magnesium (Mg), aluminum (Al), platinum (Pt), palladium (Pd), *aurum* (Au), nickel (Ni), neodymium (Nd), iridium (Ir), chromium (Cr), lithium (Li), calcium (Ca), or an alloy thereof. Alternatively, the second electrode 223 may further include a layer including ITO, IZO, ZnO, or $In_2O_3$ on the (semi-)transparent layer including the above material. The second electrode 223 is provided as a single body that covers the plurality of first electrodes 221 in the display area DA. The intermediate layer 222 and the second electrode 223 may be formed by a thermal evaporation method.

Because the organic light-emitting diode OLED is easily damaged due to external moisture or oxygen, the organic light-emitting diode OLED may be covered and protected by an encapsulation layer 300. The encapsulation layer 300 may include at least one organic encapsulation layer and at least one inorganic encapsulation layer. For example, as shown in FIG. 5, the encapsulation layer 300 may include a first inorganic encapsulation layer 310, an organic encapsulation layer 320, and a second inorganic encapsulation layer 330.

The first inorganic encapsulation layer 310 covers the second electrode 223, and may include silicon oxide, silicon nitride, and/or silicon oxynitride. Other layers such as a capping layer (not shown) may be disposed between the first inorganic encapsulation layer 310 and the second electrode 223. Because the first inorganic encapsulation layer 310 is a conformal layer formed along with a structure disposed thereunder, the organic encapsulation layer 320 is provided to cover the first inorganic encapsulation layer 310 to make an upper surface thereof flat.

The organic encapsulation layer 320 may include one or more materials selected from the group consisting of polyethylene terephthalate, polyethylene naphthalate, polycarbonate, polyimide, polyethylene sulfonate, polyoxymethylene, polyarylate, and hexamethyl disiloxane. The second inorganic encapsulation layer 330 covers the organic encapsulation layer 320, and may include silicon oxide, silicon nitride, and/or silicon oxynitride. The organic encapsulation layer 320 may be formed by applying a monomer having flowability and curing a monomer layer by using heat or light such as ultraviolet ray. Alternatively, the organic encapsulation layer 320 may be formed by applying a polymer-based material stated above.

Even when cracks occur in the encapsulation layer 300, the cracks may be disconnected between the first inorganic encapsulation layer 310 and the organic encapsulation layer 320 or between the organic encapsulation layer 320 and the second inorganic encapsulation layer 330 owing to the multi-layered structure in the encapsulation layer 300. As such, generation of an infiltration path through which the external moisture or oxygen infiltrates into the display area DA may be prevented or reduced.

In an embodiment, spacers 211 may be disposed on the pixel defining layer 209. The spacer 211 may prevent the components (e.g., organic light-emitting diode OLED) between the substrate 100 and the spacer 211 from being damaged by ensuring a certain space above the organic light-emitting diode OLED. The spacer 211 may be disposed between the encapsulation layer 300 and the pixel defining layer 209. In another embodiment, the spacer 211 may be omitted.

The spacer 211 may include an organic insulating material such as polyimide and/or an inorganic insulating material such as silicon nitride or silicon oxide. In an embodiment, the spacer 211 may include a different material from that of the pixel defining layer 209. In another embodiment, the spacer 211 may include the same material as that of the pixel defining layer 209. When the spacer 211 and the pixel defining layer 209 is formed using the same material, the pixel defining layer 209 and the spacer 211 may be formed at the same time using a halftone mask. Also, in some embodiments, the spacer 211 may include the light-blocking material described above.

The touch electrode layer 400 may be disposed on the encapsulation layer 300. The touch electrode layer 400 may include a first sub-conductive layer CTL1, a second sub-conductive layer CTL2, and a touch insulating layer 410. Also, the touch electrode layer 400 may further include a touch buffer layer 401.

The touch buffer layer 401 may be disposed directly on the encapsulation layer 300. The touch buffer layer 401 prevents damage to the encapsulation layer 300 and may block an interference signal that may generate when the touch electrode layer 400 operates. The touch buffer layer 401 may include an inorganic insulating material such as silicon oxide, silicon nitride, and silicon oxynitride, or an organic insulating material. Also, the touch buffer layer 401 may have a single-layered or multi-layered structure. In some embodiments, the touch buffer layer 401 may be omitted.

The first sub-conductive layer CTL1, the touch insulating layer 410, and the second sub-conductive layer CTL2 may be sequentially stacked on the touch buffer layer 401. The first sub-conductive layer CTL1 and the second sub-conductive layer CTL2 may be disposed under and on the touch insulating layer 410, respectively.

In an embodiment, the second sub-conductive layer CTL2 may act as a sensor for sensing a contact, and the first sub-conductive layer CTL1 may act as a connector for connecting the second sub-conductive layer CTL2 that is patterned in one direction.

In another embodiment, the first sub-conductive layer CTL1 may act as a sensor for sensing a contact, and the second sub-conductive layer CTL2 may act as a connector for connecting the first sub-conductive layer CTL1 that is patterned in one direction.

In another embodiment, the first sub-conductive layer CTL1 and the second sub-conductive layer CTL2 may both act as sensors. In this case, the first sub-conductive layer CTL1 and the second sub-conductive layer CTL2 may be connected via touch contact holes 410*ct* in the touch insulating layer 410. As described above, when the first sub-conductive layer CTL1 and the second sub-conductive layer CTL2 both act as the sensors, resistance of the touch electrode is reduced and a response speed of the touch electrode layer 400 may be improved.

In some embodiments, the first sub-conductive layer CTL1 and the second sub-conductive layer CTL2 may have mesh structures, such that the light emitted from the organic light-emitting diode OLED may pass therethrough the touch electrode layer 400. Accordingly, the first sub-conductive layer CTL1 and the second sub-conductive layer CTL2 may not overlap the light-emitting regions in the organic light-emitting diode OLED.

The first sub-conductive layer CTL1 and the second sub-conductive layer CTL2 may each include a metal layer or a transparent conductive layer, and the metal layer may include molybdenum (Mo), argentum (Ag), titanium (Ti), copper (Cu), aluminum (Al), and an alloy thereof. The transparent conductive layer may include a transparent conductive oxide material such as indium tin oxide (ITO), indium zinc oxide (IZO), zinc oxide (ZnO), indium tin zinc oxide (ITZO), etc. Alternatively, the transparent conductive layer may include a conductive polymer such as poly(3,4-ethylenedioxythiophene) (PEDOT), metal nano-wire, carbon nanotubes, graphene, etc. In an embodiment, the first sub-conductive layer CTL1 and the second sub-conductive layer CTL2 may each have a triple-layered structure including a Ti layer, an Al layer, and a Ti layer.

The touch insulating layer 410 may include an inorganic material or an organic material. The inorganic material may include at least one selected from silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. The organic material may include at least one selected from an acryl-based resin, methacrylic resin, polyisoprene, vinyl-based resin, epoxy-based resin, urethane-based resin, cellulose-based resin, and perylene-based resin.

A first functional layer 500 may be disposed on the touch electrode layer 400. The first functional layer 500 may include an optical layer 510 and a lower light-blocking layer 520.

The optical layer 510 may be provided to improve an optical performance of the display apparatus 1 (see FIG. 1) and may include an upper organic insulating layer 511 and an upper planarization layer 513.

The upper organic insulating layer 511 of the optical layer 510 may be disposed on the touch insulating layer 410 while covering the second sub-conductive layer CTL2. The upper organic insulating layer 511 may overlap the pixel defining layer 209. Also, the upper organic insulating layer 511 may have a first opening OP1 exposing the emission area EA and overlapping the pixel opening OP4. In a cross-sectional view, a width (second width) W2 of the first opening OP1 in the upper organic insulating layer 511 may be greater than the width (first width) W1 of the emission area EA (or the pixel opening OP4). That is, in a plan view, an area of the first opening OP1 in the upper organic insulating layer 511 may be greater than that of the emission area EA (or area of the pixel opening OP4).

The upper organic insulating layer 511 of the optical layer 510 may include a photoresist material. The upper organic insulating layer 511 may be obtained by entirely applying a photoresist material onto the encapsulation layer 300 and then exposing and developing the photoresist material. The upper organic insulating layer 511 may cover the conductive layer included in the touch electrode layer 400, e.g., the first sub-conductive layer CTL1 and the second sub-conductive layer CTL2, in order to protect the conductive layer.

The upper planarization layer 513 of the optical layer 510 is disposed on the upper organic insulating layer 511 and may fill the first opening OP1 of the upper organic insulating layer 511. For example, the upper planarization layer 513 may be entirely filled in the first opening OP1 of the upper organic insulating layer 511. The upper planarization layer 513 includes a flat surface, and a thickness of a portion in the upper planarization layer 513 filling the first opening OP1 may be greater than that of other regions (e.g., a portion overlapping the upper surface of the upper organic insulating layer 511).

The upper planarization layer 513 may be in contact with an inner side surface 511s of the upper organic insulating layer 511 in a direction toward the emission area EA. Also, the upper planarization layer 513 may be in contact with the upper surface of the touch insulating layer 410 via the first opening OP1 of the upper organic insulating layer 511.

In an embodiment, the upper planarization layer 513 may include a material having a refractive index that is greater than that of the material included in the upper organic insulating layer 511. For example, the upper planarization layer 513 may include an organic material having a high refractive index. The light emitted obliquely from the organic light-emitting diode OLED is totally reflected by the inner side surface 511s of the upper organic insulating layer 511 and then may proceed outside the display apparatus, and thus, the light-emitting efficiency of the organic light-emitting diode OLED may be improved and the luminance may increase.

In an embodiment, the refractive index of the upper organic insulating layer 511 may range from about 1.3 to about 1.6. For example, the refractive index of the upper organic insulating layer 511 may range from about 1.4 to about 1.55. In detail, the upper organic insulating layer 511 may include an acryl-based organic material having a refractive index ranging from about 1.3 to about 1.6 (or about 1.4 to about 1.55). For example, the upper organic insulating layer 511 may include an acryl-based resin (polymethacrylate, polyacrylic acid, etc.), ethylhexyl acrylate, pentrafluoropropyl acrylate, polyethylene glycol dimethacrylate, ethylene glycol dimethacrylate, etc. In some embodiments, the upper organic insulating layer 511 may further include a thermal curing agent, and/or a photocuring agent.

In an embodiment, a refractive index of the upper planarization layer 513 may range from about 1.65 to about 1.85. The upper planarization layer 513 may include an acryl-based or siloxane-based organic material. In some embodiments, the upper planarization layer 513 may include polydiarylsiloxane, methyltrimethoxysilane, tetramethoxysilane, etc. In some embodiments, the upper planarization layer 513 may include particles having high refractive index dispersed in the upper planarization layer 513. For example, the upper planarization layer 513 may include metal oxide particles such as zinc oxide ($ZnO_x$), titanium oxide ($TiO_2$), zirconium oxide ($ZrO_2$), barium titanate ($BaTiO_3$), etc. dispersed therein. The upper planarization layer 513 may be obtained by applying an organic material including metal oxide particles by using an inkjet printing.

In an embodiment, the upper organic insulating layer 511 may include the inner side surface 511s having an inclined surface. In detail, the inner side surface 511s of the upper organic insulating layer 511 may have an inclined surface that is tapered in a forward direction with respect to the upper surface of the encapsulation layer 300 or the upper surface of the substrate 100. That is, in a cross-sectional view, a width of the first opening OP1 increases away from the substrate 100, and in a plan view, an area of the first opening OP1 may increase away from the substrate 100.

The lower light-blocking layer 520 may be disposed between the upper organic insulating layer 511 and the upper planarization layer 513. In detail, the lower light-blocking layer 520 may cover at least a part of the inner side surface 511s and the upper surface of the upper organic insulating layer 511, and may be covered by the upper planarization layer 513.

The lower light-blocking layer 520 may absorb at least a part of the light proceeding in an inclined direction with respect to the upper surface of the substrate 100 among light emitted from the organic light-emitting diode OLED and/or internally reflected. The lower light-blocking layer 520 may include a black pigment. The lower light-blocking layer 520 may include black matrix.

In addition, the lower light-blocking layer 520 may include a photoresist. First, a photoresist is applied in various methods such as a spin-coating method, a slit-coating method, a spraying method, a dipping method, etc., to form a photoresist layer. Next, the photoresist layer is at least partially exposed and may be at least partially removed. In addition, a remaining photoresist layer is hardened to form the lower light-blocking layer 520. In an embodiment, the upper light-blocking layer 610 may be formed in a similar way to that of the lower light-blocking layer 520.

Referring to FIG. 5, the lower light-blocking layer 520 may include the blocking portion 520a and the non-blocking portion 520b. The blocking portion 520a of the lower light-blocking layer 520 denotes a portion of the lower light-blocking layer 520, which is at a direction where the lower light-blocking layer 520 surrounding the emission area EA covers the inner surface 511s of the upper organic insulating layer 511, and the non-blocking portion 520b denotes a portion of the lower light-blocking layer 520, which is at a direction where the lower light-blocking layer 520 surrounding the emission area EA does not cover the inner surface 511s of the upper organic insulating layer 511. As described above with reference to FIGS. 4A to 4C, the lower light-blocking layer 520 surrounds the emission area EA in a plan view. Here, a portion that at least partially surrounds the emission area EA and where the edge of the second opening OP2 corresponds to the edge of the emission area EA is the blocking portion 520a, and a portion that surrounds the remaining part of the emission area EA and where the edge of the second opening OP2 does not correspond to the edge of the emission area EA is the non-blocking portion 520b.

At a portion where the blocking portion 520a is provided, light proceed obliquely to the substrate 100 among the light emitted from the organic light-emitting diode OLED and/or the internally reflected light may be absorbed by the blocking portion 520a. On the contrary, at a portion where the non-blocking portion 520b is provided, light proceed obliquely to the substrate 100 among the light emitted from the organic light-emitting diode OLED and/or the internally reflected light may be reflected from the inner side surface 511s of the upper organic insulating layer 511. As described above, because the emission of light is selectively blocked but the blocking portion 520a, the viewing angle adjusting performance of the display apparatus 1 (see FIG. 1) according to the directions may be improved.

In an embodiment, when seen from the direction perpendicular to the substrate 100, the edge of the blocking portion 520a in the lower light-blocking layer 520 may correspond to the edge of the emission area EA (or the edge of the pixel opening OP4). In detail, when seen from the direction perpendicular to the substrate 100, a distance from the edge of the blocking portion 520a in the direction toward the emission area EA to the center of the emission area EA may be equal to a distance from the edge of the pixel defining layer 209 (or the edge of the pixel opening OP4) in the direction toward the emission area to the center of the emission area EA.

In addition, when seen from the direction perpendicular to the substrate 100, the edge of the non-blocking portion 520b of the lower light-blocking layer 520 may not correspond to the edge of the emission area EA (or the edge of the pixel opening OP4). In detail, when seen from the direction perpendicular to the substrate 100, a distance from the edge of the non-blocking portion 520b in the direction toward the emission area EA to the center of the emission area EA may be greater than a distance from the edge of the pixel defining layer 209 (or the edge of the pixel opening OP4) in the direction toward the emission area to the center of the emission area EA.

The second functional layer 600 (see FIG. 3) may be disposed on the first functional layer 500. In an embodiment, as shown in FIG. 5, the second functional layer 600 may include the upper light-blocking layer 610.

The upper light-blocking layer 610 may absorb at least a part of the light emitted from the organic light-emitting diode OLED and/or internally reflected and proceeding in an inclined direction with respect to the upper surface of the substrate 100. The upper light-blocking layer 610 may include a black pigment. The upper light-blocking layer 610 may include black matrix.

Referring to FIG. 5, the upper light-blocking layer 610 may be on the upper planarization layer 513. The upper light-blocking layer 610 overlaps the lower light-blocking layer 520. The upper light-blocking layer 610 may include a third opening OP3 overlapping the emission area EA, the pixel opening OP4, the first opening OP1, and the second opening OP2.

Referring to FIG. 5, the upper light-blocking layer 610 may include a first portion 610a overlapping the blocking portion 520a of the lower light-blocking layer 520 and a second portion 610b overlapping the non-blocking portion 520b of the lower light-blocking layer 520. The upper light-blocking layer 610 may surround the emission area EA in a plan view like the lower light-blocking layer 520. In a plan view, when the edge of the upper light-blocking layer 610 corresponds to the edge of the lower light-blocking layer 520, it may be understood that the first portion 610a is a portion that at least partially surrounds the emission area EA and where the edge of the third opening OP3 corresponds to the edge of the emission area EA, and the second portion 610b is a portion that surrounds the remaining part of the emission area EA and where the edge of the third opening OP3 does not correspond to the edge of the emission area EA.

In an embodiment, when seen from the direction perpendicular to the substrate 100, the edge of the first portion 610a in the upper light-blocking layer 610 may correspond to the edge of the emission area EA (or the edge of the pixel opening OP4). In detail, when seen from the direction perpendicular to the substrate 100, a distance from the edge of the first portion 610a in the direction toward the emission area EA to the center of the emission area EA may be equal to a distance from the edge of the pixel defining layer 209 (or the edge of the pixel opening OP4) in the direction toward the emission area EA to the center of the emission area EA.

In addition, when seen from the direction perpendicular to the substrate 100, the edge of the second portion 610b of the upper light-blocking layer 610 may not correspond to the edge of the emission area EA (or the edge of the pixel opening OP4). In detail, when seen from the direction perpendicular to the substrate 100, a distance from the edge of the second portion 610b in the direction toward the emission area EA to the center of the emission area EA may be greater than a distance from the edge of the pixel defining layer 209 (or the edge of the pixel opening OP4) in the direction toward the emission area EA to the center of the emission area EA.

In an embodiment, a vertical distance vd from the lower surface of the upper light-blocking layer 610 to the upper surface of the emission layer 222b may be 25 μm or greater, for example, 30 μm or greater. As such, light proceed obliquely with respect to the surface of the substrate 100 among the light emitted from the organic light-emitting diode OLED and/or the internally reflected light may be effectively blocked.

Figure 6:
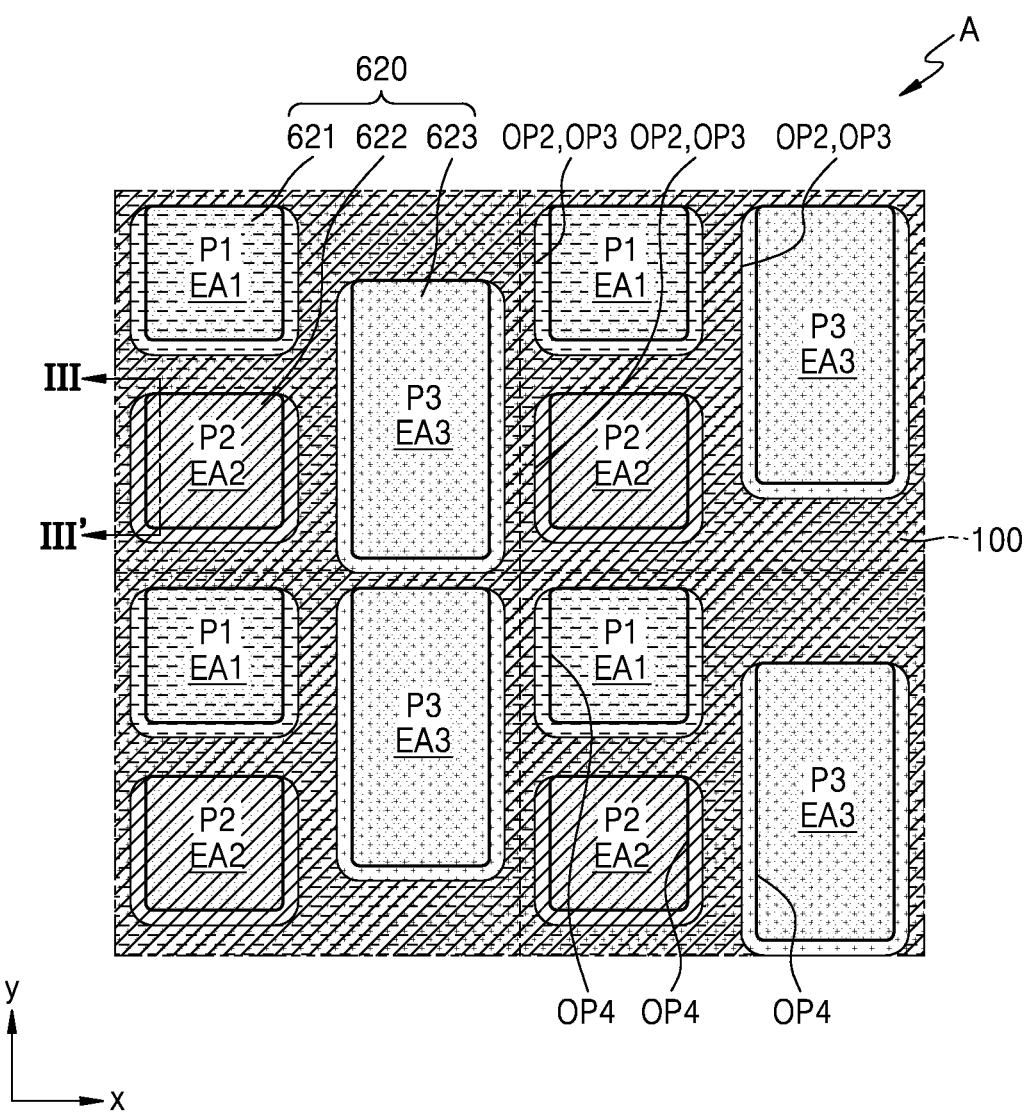
FIG. 6 is a schematic plan view partially showing a display apparatus according to an embodiment.
Figure 7:
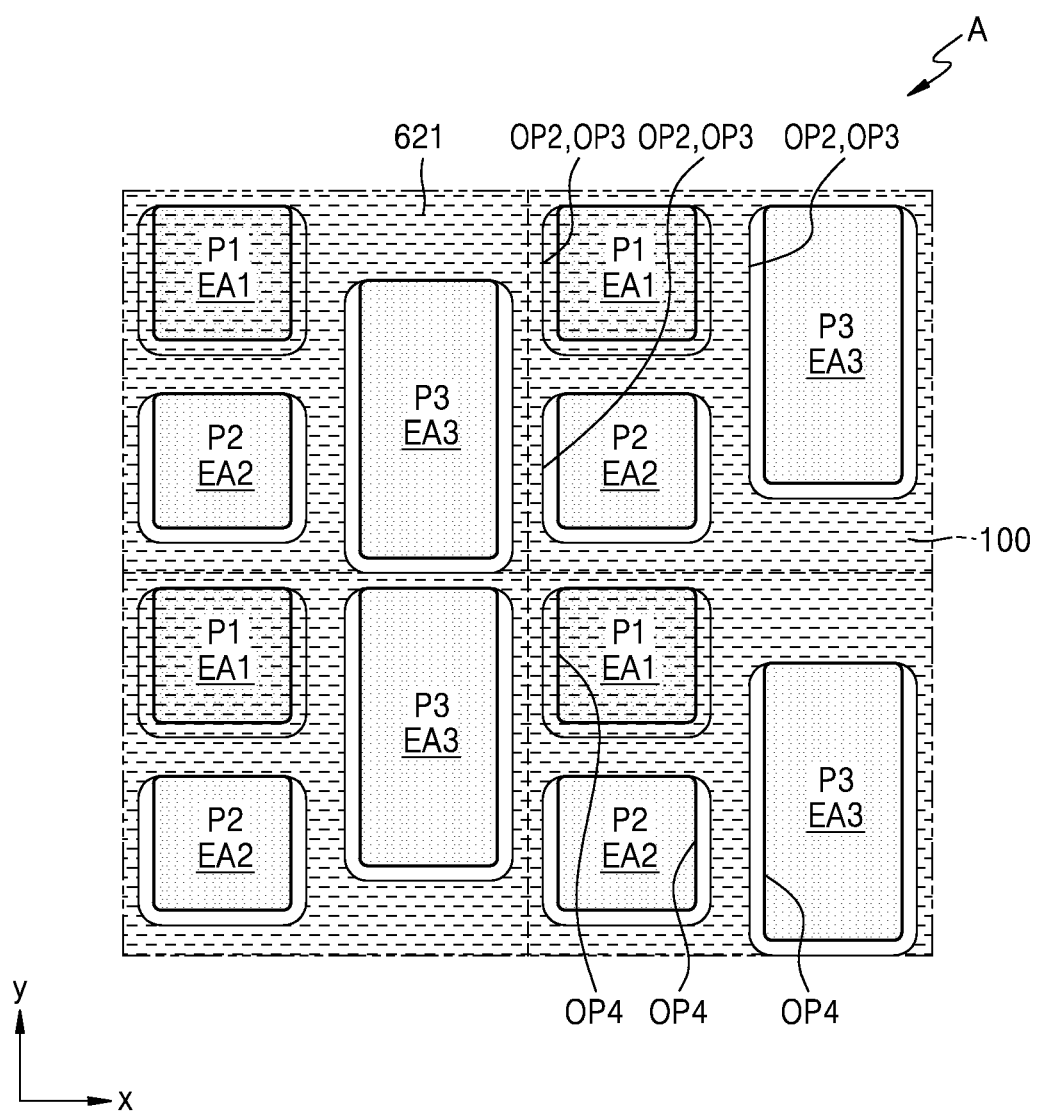
FIGS. 7, 8 and 9 are plan views respectively showing color filter layers included in the display apparatus of FIG. 6.
Figure 8:
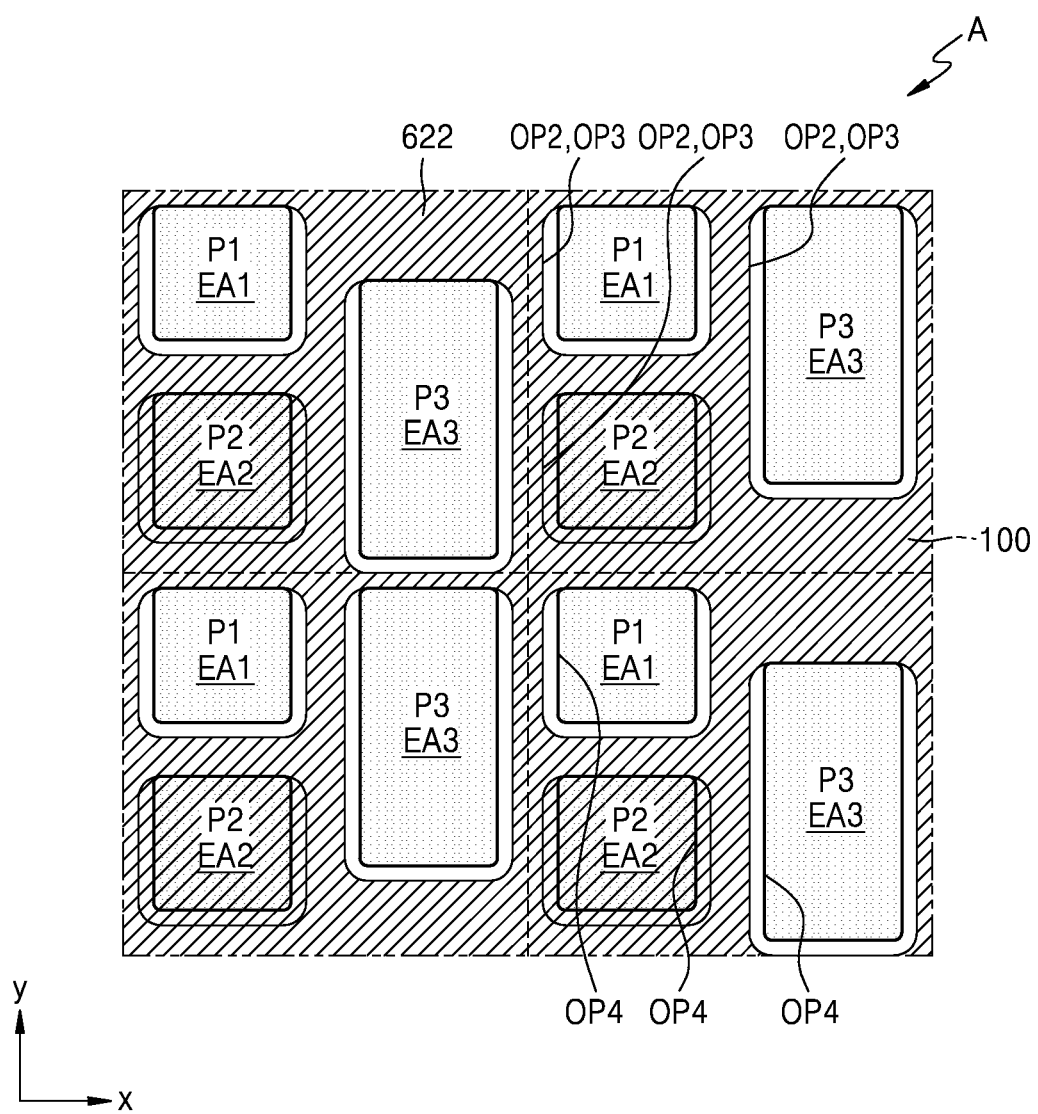
Figure 9:
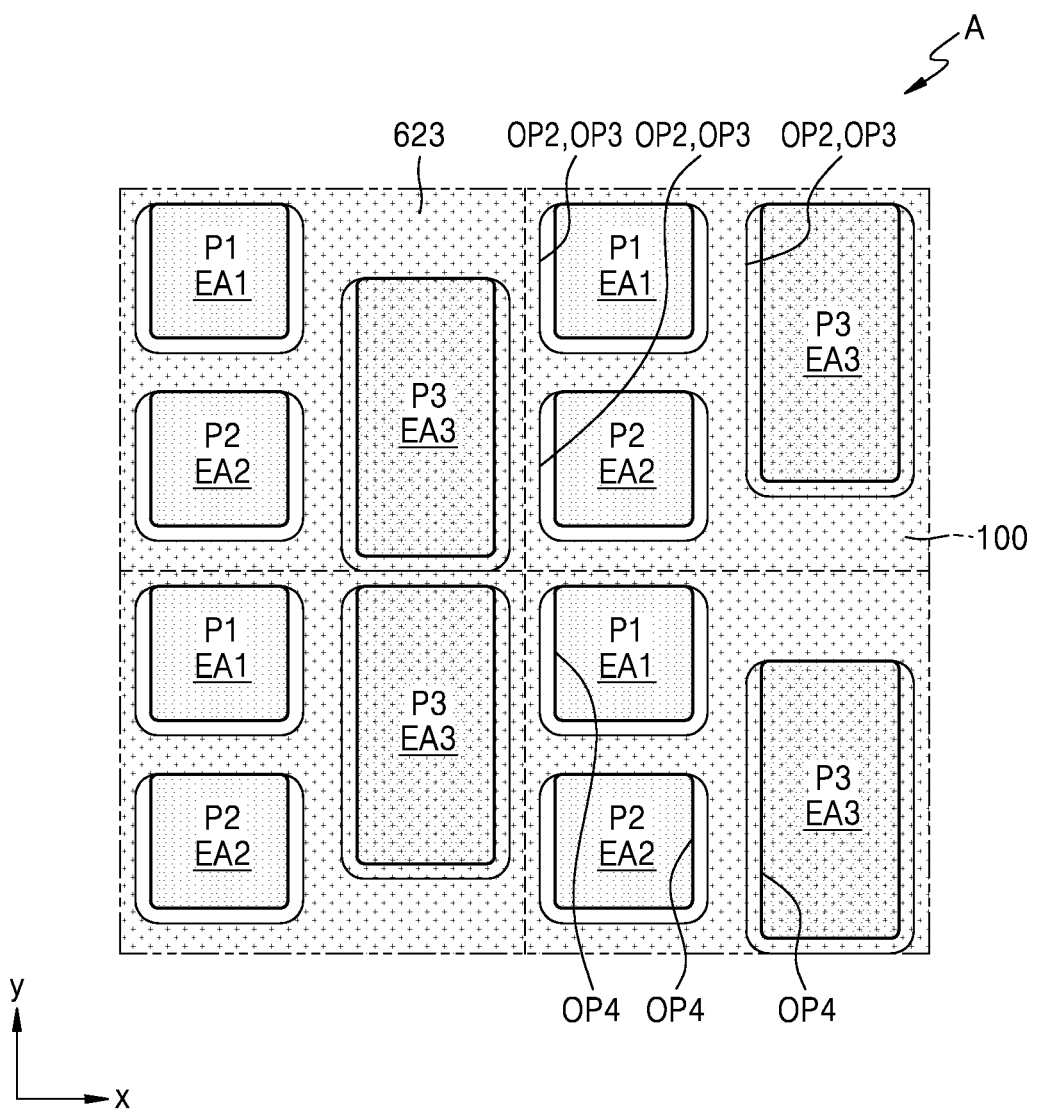

FIG. 6 is a plan view showing a region of the display apparatus according to an embodiment, and FIGS. 7 to 9 are plan views showing color filter layers included in the display apparatus of FIG. 6. Hereinafter, like reference numerals denote like elements, and descriptions about the elements described above will be omitted.

FIG. 6 is a plan view corresponding to an enlarged view showing some components that may be included in the region A of FIG. 1. Also, FIG. 6 shows a state in which first to third color filters 621, 622, and 623 of FIGS. 7 to 9 are arranged overlapping each other. In addition, in FIGS. 6 to 9, components other than the color filter layer 620 from among the components on the substrate 100 are omitted for convenience of description.

As shown in FIG. 6, the display apparatus 1 (see FIG. 1) according to an embodiment may include the color filter layer 620 that is a modified example of the second functional layer 600 (see FIG. 3).

A first pixel P1 includes a first color emission area EA1, a second pixel P2 includes a second color emission area EA2, and a third pixel P3 includes a third color emission area EA3. The color filter layer 620 may include a first-color color filter 621 covering the first color emission area EA1, a second-color color filter 622 covering the second color emission area EA2, and a third-color color filter 623 covering the third color emission area EA3.

Referring to FIG. 7, the first-color color filter 621 covers the first color emission area EA1 but does not cover the second color emission area EA2 and the third color emission area EA3. That is, the first-color color filter 621 is arranged to entirely cover the substrate 100, and includes openings corresponding respectively to the second color emission area EA2 and the third color emission area EA3. Here, an edge of the opening in the first-color color filter 621 may correspond to the edges of the second opening OP2 and the third opening OP3 in the lower light-blocking layer 520 (see FIG. 5).

Referring to FIG. 8, the second-color color filter 622 covers the second color emission area EA2 but may not cover the first color emission area EA1 and the third color emission area EA3. That is, the second-color color filter 622 is arranged to entirely cover the substrate 100, and includes openings corresponding respectively to the first color emission area EA1 and the third color emission area EA3. Here, an edge of the opening in the second-color color filter 622 may correspond to the edges of the second opening OP2 and the third opening OP3 in the lower light-blocking layer 520 (see FIG. 5).

Referring to FIG. 9, the third-color color filter 623 covers the third color emission area EA3 and may not cover the first color emission area EA1 and the second color emission area EA2. That is, the third-color color filter 623 is arranged to entirely cover the substrate 100, and includes openings corresponding respectively to the first color emission area EA1 and the second color emission area EA2. Here, an edge of the opening in the third-color color filter 623 may correspond to the edges of the second opening OP2 and the third opening OP3 in the lower light-blocking layer 520 (see FIG. 5).

In addition, in each of the first to third-color color filters 621 to 623, at least a part of the edge of the opening may correspond to the edge of the pixel opening OP4. That is, in each of the first to third-color color filters 621 to 623, at least a part of the edge of the opening may correspond to the edge of the emission area EA in a plan view. In the edge of the opening in each of the first to third-color color filters 621 to 623, a portion which covers an inner side surface 511s of the upper organic insulating layer 511 in a plan view corresponding to a portion showing a large effect of blocking the path of the light that proceeds in an inclined direction with respect to the front of the emission area EA (e.g., a direction perpendicular to the upper surface of the emission layer) as compared with the other region. In the edge of the opening in each of the first to third-color color filters 621 to 623, a portion which covers an inner side surface 511s of the upper organic insulating layer 511 in a plan view may be selectively provided in regions in which the viewing angle adjusting performance needs to be improved, and may be variously modified according to the designs.

Figure 10:
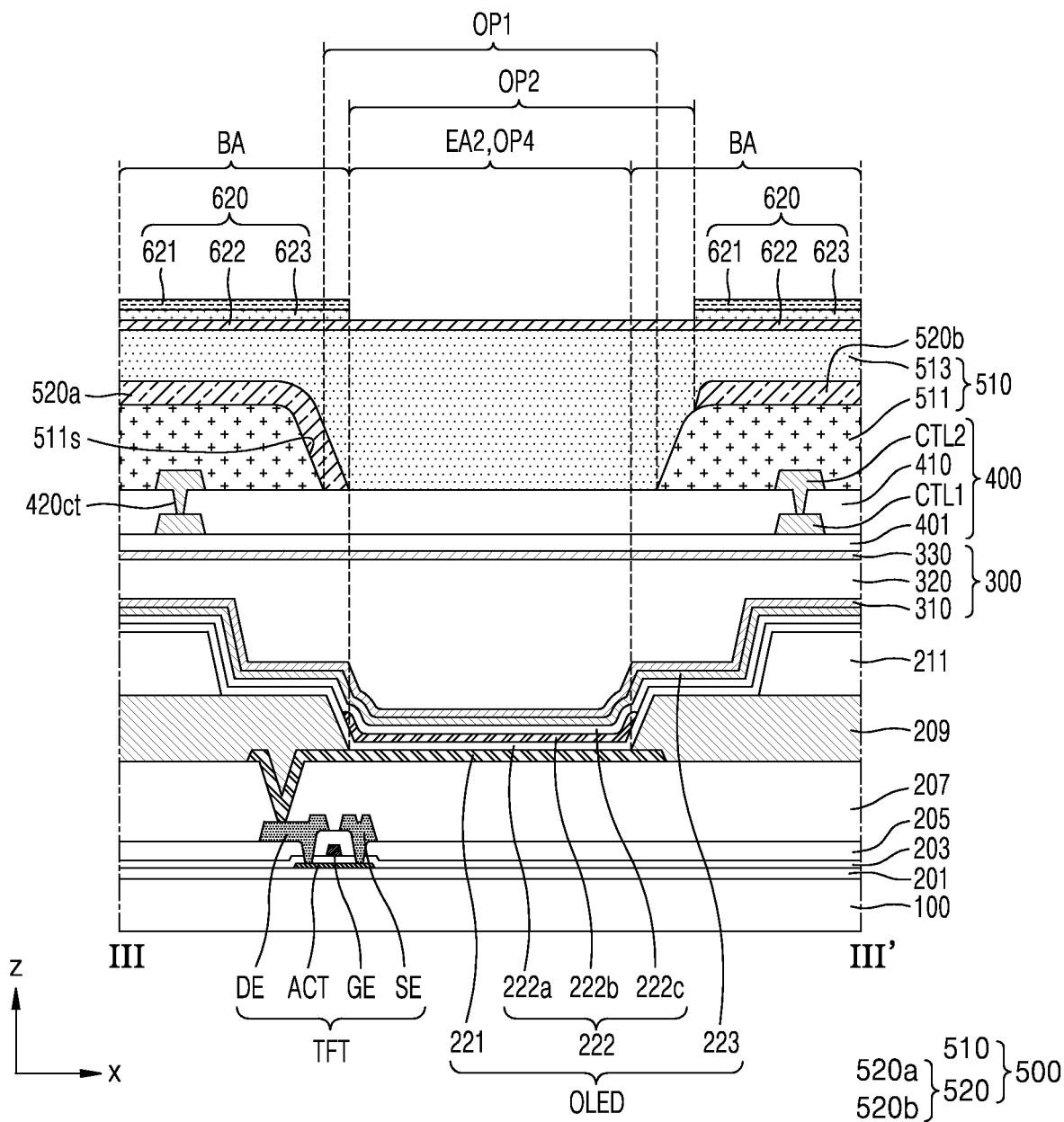
FIG. 10 is a cross-sectional view showing a region of the display apparatus of FIG. 6.

FIG. 10 is a cross-sectional view showing a region of the display apparatus of FIG. 6. FIG. 10 is a cross-sectional view of the display apparatus taken along line II-II' of FIG. 6.

In addition, FIG. 10 is a cross-sectional view of the second pixel P2 and descriptions are provided based on the second pixel P2 for convenience of description. However, the description about the second pixel P2 may be applied to the first pixel P1 and the third pixel P3. Hereinafter, like reference numerals denote like elements, and descriptions about the elements described above will be omitted.

Referring to FIG. 10, the color filter layer 620 that is a modified embodiment of the second functional layer 600 (see FIG. 3) may be disposed on the first functional layer 500.

The color filter layer 620 may include a plurality of color filters. For example, the color filter layer 620 may include the first-color color filter 621, the second-color color filter 622, and the third-color color filter 623. In an embodiment, the first-color color filter 621 may only transmit the light of a wavelength within a range of about 630 nm to 780 nm. The second-color color filter 622 may only transmit the light of a wavelength within a range of about 495 nm to about 570 nm. The third-color color filter layer 623 may only transmit the light of a wavelength within a range of about 450 nm to about 495 nm.

The color filter layer 620 may include a light-blocking area BA. The light-blocking area BA is an area where the plurality of color filters included in the color filter layer 620 overlap one another. That is, the light-blocking area BA is an area in which two or more color filters overlap each other to block light. In an embodiment, the first to third-color color filters 621, 622, and 623 included in the color filter layer 620 may overlap one another only in the light-blocking area BA.

The light-blocking area BA may surround each of the emission areas EA1, EA2, and EA3 in a plan view. Also, the light-blocking area BA may overlap the lower light-blocking layer 520. In an embodiment, when seen from the direction perpendicular to the substrate 100, the edge of the light-blocking area BA may correspond to the edge of the second opening OP2 in the lower light-blocking layer 520. In detail, the edge of the light-blocking area BA overlapping the blocking portion 520a of the lower light-blocking layer 520 corresponds to the edge of the blocking portion 520a, and the edge of the light-blocking area BA overlapping the non-blocking portion 520b of the lower light-blocking layer 520 corresponds to the edge of the non-blocking portion 520b.

Referring to FIG. 10, the second-color color filter 622 is disposed on the upper planarization layer 513 throughout the second color emission area EA2 and the light-blocking area BA. Also, in the light-blocking area BA, the third-color color filter 623 and the first-color color filter 621 are sequentially stacked on the second-color color filter 622, and thus, the first to third-color color filters 621, 622, and 623 are arranged overlapping one another. In addition, a stacking order of the first to third-color color filters 621, 622, and 623 in the light-blocking area BA is not restricted, but may be variously modified.

The first-color color filter 621 and the third-color color filter 623 may each have an opening overlapping the second color emission area EA2, the first opening OP1 of the upper organic insulating layer 511, and the second opening OP2 of the lower light-blocking layer 520. That is, the first-color color filter 621 and the third-color color filter 623 may be selectively disposed in the light-blocking area BA without covering the second color emission area EA2. Also, when seen from the direction perpendicular to the substrate 100, the edge of each of the first and third-color color filters 621 and 623 in the direction toward the second color emission area EA2 may correspond to the edge of the lower light-blocking layer 520 in the direction toward the second color emission area EA2. In detail, the edge in each of the first and third-color color filters 621 and 623 overlapping the blocking portion 520a in the direction of the second color emission area EA2 corresponds to the edge of the blocking portion 520a, and the edge in each of the first and third-color color filters 621 and 623 overlapping the non-blocking portion 520b in the direction of the second color emission area EA2 may correspond to the non-blocking portion 520b.

Figure 11:
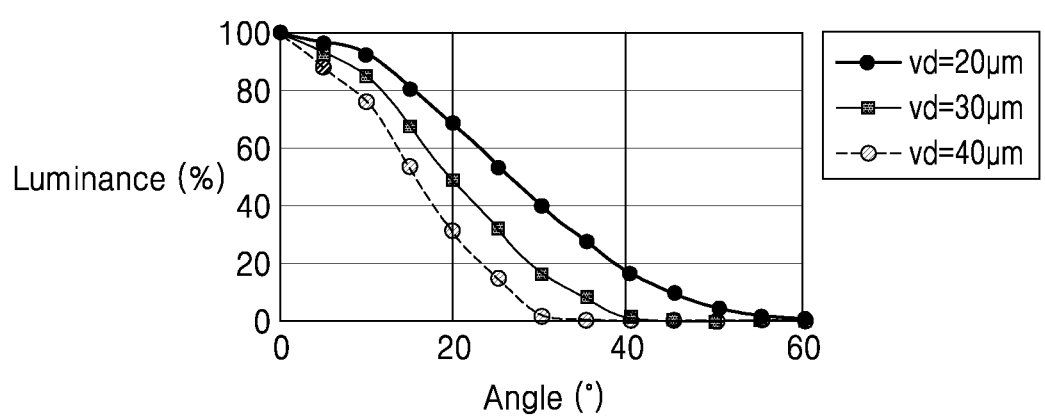
FIG. 11 is a graph showing a luminance characteristic of a display apparatus according to an embodiment.

FIG. 11 is a graph showing a luminance characteristic of the display apparatus according to an embodiment, and Table 1 below shows partial data corresponding to the graph of FIG. 11.

TABLE 1

| viewing angle | vd = 20 μm | vd = 30 μm | vd = 40 μm |
| --- | --- | --- | --- |
| 0° | 100% | 100% | 100% |
| 30° | 40.7% | 17.9% | 2.0% |
| 45° | 10.2% | 0.6% | 0% |
| 60° | 0.7% | 0% | 0% |

FIG. 11 and table 1 above illustrate luminance values (luminance (%) in FIG. 11) of the display apparatus according to a viewing angle (angle (°) in FIG. 11) and a vertical distance according to an embodiment. Here, "viewing angle" denotes an angle with respect to a direction perpendicular to the upper surface of the emission layer 222b (see FIG. 5), "vertical distance vd" denotes a distance from the lower surface of the second functional layer 600 (see FIG. 3) to the upper surface of the emission layer 222b, and "luminance value" denotes a ratio of a luminance in difference viewing angles to a luminance when the viewing angles is 0°.

The luminance of the display apparatus according to the embodiment may be reduced to 10% or less when the viewing angle is 45° or greater. In this regard, referring to FIG. 11 and table 1 above, the luminance decreases as the viewing angle increases. When the vertical distance vd is 30 μm and 20 μm, it may be identified that the luminance value is approximately less than 10% when the viewing angle is 45° or greater. On the contrary, when the vertical distance vd is 20 μm, the luminance value is 10.2%, that is, exceeding 10%, when the viewing angle is 45°. When a sufficient vertical distance vd is not ensured, the light proceed obliquely to the substrate may not effectively blocked.

Therefore, the vertical distance vd from the lower surface of the second functional layer 600 to the upper surface of the emission layer 222b in the display apparatus according to the embodiment may be 25 μm or greater, for example, 30 μm or greater.

The display apparatus has been described, but one or more embodiments of the disclosure are not limited thereto. For example, a method of manufacturing the display apparatus may be also included in the scope of the disclosure.

According to one or more embodiments, the display apparatus having an improved performance of adjusting viewing angle may be implemented. However, the scope of one or more embodiments is not limited to the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a substrate;
   a display layer disposed on the substrate, the display layer including an emission area;
   a touch electrode layer disposed over the display layer, the touch electrode layer including at least one conductive layer;
   an upper organic insulating layer disposed over the touch electrode layer, the upper organic insulating layer having a first opening overlapping the emission area;
   a lower light-blocking layer disposed on the upper organic insulating layer, the lower light-blocking layer having a second opening overlapping the first opening in a plan view;
   an upper planarization layer covering the lower light-blocking layer, the upper planarization layer filling the first opening and comprising a portion which directly contacts the upper organic insulating layer; and
   an upper light-blocking layer disposed on the upper planarization layer, the upper light-blocking layer overlapping the lower light-blocking layer in a plan view and having a third opening overlapping the second opening in a plan view.

2. The display apparatus of claim 1, wherein the lower light-blocking layer comprises a blocking portion at least partially covering an inner side surface of the upper organic insulating layer which extends obliquely to the substrate.

3. The display apparatus of claim 2, wherein the display layer includes a pixel defining layer having a pixel opening overlapping the emission area, and a distance from an edge of the blocking portion in a direction of the emission area to a center of the emission area is equal to a distance from an edge of the pixel defining layer in a direction of the emission area to the center of the emission area in a plan view.

4. The display apparatus of claim 3, wherein the lower light-blocking layer further comprises a non-blocking portion not covering the inner side surface of the upper organic insulating layer in a plan view.

5. The display apparatus of claim 4, wherein a distance from an edge of the non-blocking portion in a direction of the emission area to the center of the emission area is greater than a distance from the edge of the pixel defining layer in a direction of the emission area to the center of the emission area in a plan view.

6. The display apparatus of claim 1, wherein a distance from an edge of the lower light-blocking layer in a direction of the emission area to a center of the emission area is equal to a distance from an edge of the upper light-blocking layer in a direction of the emission area to the center of the emission area in a plan view.

7. The display apparatus of claim 1, wherein a luminance of light emitted from the emission area is reduced to about 10% or less when a viewing angle is 45 degrees or greater.

8. The display apparatus of claim 1, wherein the display layer includes an organic light-emitting diode having a first electrode, a second electrode, and an intermediate layer between the first electrode and the second electrode, the intermediate layer including an emission layer, and a vertical distance from a lower surface of the upper light-blocking layer to an upper surface of the emission layer is about 25 µm or greater.

9. The display apparatus of claim 1, wherein the upper planarization layer has a refractive index that is greater than a refractive index of the upper organic insulating layer.

10. The display apparatus of claim 9, wherein an area of the first opening increases away from the substrate, when seen from a direction perpendicular to the substrate.

11. The display apparatus of claim 1, further comprising:
an encapsulation layer on the display layer,
wherein the touch electrode layer is between the encapsulation layer and the upper planarization layer.

12. A display apparatus comprising:
a substrate;
a display layer disposed on the substrate, the display layer including a plurality of emission areas;
a touch electrode layer disposed over the display layer, the touch electrode layer including at least one conductive layer;
an upper organic insulating layer disposed over the display layer touch electrode layer, the upper organic insulating layer having a first opening overlapping each of the plurality of emission areas;
a lower light-blocking layer disposed on the upper organic insulating layer, the lower light-blocking layer having a second opening overlapping the first opening;
an upper planarization layer covering the lower light-blocking layer, the upper planarization layer filling the first opening and comprising a portion which directly contacts the upper organic insulating layer; and
a color filter layer disposed on the upper planarization layer, the color filter layer including a light-blocking area overlapping the lower light-blocking layer in a plan view,
wherein a plurality of color filters is arranged to overlap one another in the light-blocking area.

13. The display apparatus of claim 9, wherein the plurality of emission areas include a first color emission area, a second color emission area, and a third color emission area, the plurality of color filters include a first-color color filter covering the first color emission area, a second-color color filter covering the second color emission area, and a third-color color filter covering the third color emission area, and the first-color color filter, the second-color color filter, and the third-color color filter overlap one another in the light-blocking area.

14. The display apparatus of claim 9, wherein the lower light-blocking layer includes a blocking portion at least partially covering an inner side surface of the upper organic insulating layer which extend obliquely to the substrate, and
wherein the light-blocking area overlaps the blocking portion.

15. The display apparatus of claim 14, wherein the display layer includes a pixel defining layer having a pixel opening overlapping the emission area, and a distance from an edge of the blocking portion in a direction of the emission area to a center of the emission area is equal to a distance from an edge of the pixel defining layer in the direction of the emission area to the center of the emission area.

16. The display apparatus of claim 15, wherein the lower light-blocking layer includes a non-blocking portion not covering an inner side surface of the upper organic insulating layer in a plan view, and
wherein the light-blocking area overlaps the non-blocking portion.

17. The display apparatus of claim 16, wherein a distance from an edge of the non-blocking portion in the direction of the emission area to the center of the emission area is greater than a distance from the edge of the pixel defining layer in the direction of the emission area to the center of the emission area in a plan view.

18. The display apparatus of claim 12, wherein a distance from an edge of the lower light-blocking layer in a direction of the emission area to a center of the emission area is equal to a distance from an edge of the light-blocking area in a direction of the emission area to the center of the emission area in a plan view.

19. The display apparatus of claim 12, wherein the upper planarization layer has a refractive index that is greater than a refractive index of the upper organic insulating layer.

20. The display apparatus of claim 12, further comprising:
an encapsulation layer on the display layer,
wherein the touch electrode layer is between the encapsulation layer and the upper planarization layer.

* * * * *